(12) United States Patent
Jeon et al.

(10) Patent No.: US 10,153,219 B2
(45) Date of Patent: Dec. 11, 2018

(54) FAN OUT WAFER LEVEL PACKAGE TYPE SEMICONDUCTOR PACKAGE AND PACKAGE ON PACKAGE TYPE SEMICONDUCTOR PACKAGE INCLUDING THE SAME

(71) Applicant: Samsung Electronics Co., Ltd., Suwon-si (KR)

(72) Inventors: Hyung-jun Jeon, Seoul (KR); Nae-in Lee, Seoul (KR); Byung-Iyul Park, Seoul (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/629,072

(22) Filed: Jun. 21, 2017

(65) Prior Publication Data

US 2018/0076103 A1 Mar. 15, 2018

(30) Foreign Application Priority Data

Sep. 9, 2016 (KR) .................... 10-2016-0116579

(51) Int. Cl.
*H01L 23/498* (2006.01)
*H01L 23/538* (2006.01)
(Continued)

(52) U.S. Cl.
CPC .......... *H01L 23/045* (2013.01); *H01L 23/047* (2013.01); *H01L 23/5385* (2013.01); *H01L 23/5389* (2013.01); *H01L 24/19* (2013.01); *H01L 25/105* (2013.01); *H01L 23/3128* (2013.01); *H01L 2224/04105* (2013.01); *H01L 2224/12105* (2013.01); *H01L 2225/1029* (2013.01); *H01L 2225/1035* (2013.01); *H01L 2225/1041* (2013.01); *H01L 2225/1058* (2013.01); *H01L 2924/1434* (2013.01); *H01L 2924/1436* (2013.01);
(Continued)

(58) Field of Classification Search
CPC ... H01L 2224/1623; H01L 2224/16227; H01L 23/49827; H01L 23/49838; H01L 23/49833; H01L 23/49816; H01L 23/49805
See application file for complete search history.

(56) References Cited

U.S. PATENT DOCUMENTS 7,528,482 B2  5/2009  Huang et al.
7,830,004 B2  11/2010  Wu
(Continued)

*Primary Examiner* — Mary Wilczewski
*Assistant Examiner* — Tsz Chiu
(74) *Attorney, Agent, or Firm* — Muir Patent Law, PLLC

(57) ABSTRACT

A semiconductor package of a package on package type includes a lower package including a printed circuit board (PCB) substrate including a plurality of base layers and a cavity penetrating the plurality of base layers, a first semiconductor chip in the cavity. a redistribution structure on a first surface of the PCB substrate and on an active surface of the first semiconductor chip, a first cover layer covering the redistribution structure, and the second cover layer covering a second surface of the PCB substrate and an inactive surface of the first semiconductor chip, and an upper package on the second cover layer of the lower package and including a second semiconductor chip.

20 Claims, 33 Drawing Sheets

(51) Int. Cl.
  *H01L 23/045* (2006.01)
  *H01L 23/047* (2006.01)
  *H01L 25/10* (2006.01)
  *H01L 23/00* (2006.01)
  *H01L 23/31* (2006.01)

(52) U.S. Cl.
  CPC ............... *H01L 2924/1437* (2013.01); *H01L 2924/15311* (2013.01); *H01L 2924/3511* (2013.01)

(56) References Cited

U.S. PATENT DOCUMENTS

| | | |
|---|---|---|
| 7,863,096 B2 | 1/2011 | England |
| 8,455,300 B2 | 1/2013 | Chi et al. |
| 8,450,844 B2 | 5/2013 | Shin et al. |
| 8,736,065 B2 | 5/2014 | Gonzalez et al. |
| 8,759,964 B2 | 6/2014 | Pu et al. |
| 9,293,385 B2 | 3/2016 | Pagaila et al. |
| 9,343,434 B2 | 5/2016 | Chen |
| 9,704,735 B2 * | 7/2017 | Konchady ............ H01L 23/5383 |
| 9,748,177 B2 * | 8/2017 | Teh ...................... H01L 23/5389 |
| 9,768,133 B1 * | 9/2017 | Wu ........................ H01L 21/565 |
| 9,853,003 B1 * | 12/2017 | Han ...................... H01L 23/645 |
| 2006/0087037 A1 | 4/2006 | Hsu |
| 2006/0125080 A1 | 6/2006 | Hsu |
| 2006/0145328 A1 | 7/2006 | Hsu |
| 2014/0093999 A1 * | 4/2014 | Teh ...................... H01L 21/568 |
| | | 438/107 |
| 2014/0110856 A1 | 4/2014 | Lin |
| 2015/0069623 A1 | 3/2015 | Tsai et al. |
| 2015/0102502 A1 * | 4/2015 | Chiu .................... H01L 21/561 |
| | | 257/774 |
| 2015/0348904 A1 | 12/2015 | Huang et al. |
| 2016/0056057 A1 * | 2/2016 | Yu ....................... H01L 21/4846 |
| | | 257/774 |
| 2016/0099213 A1 | 4/2016 | Tae et al. |
| 2016/0172291 A1 | 6/2016 | Kim et al. |

* cited by examiner

FAN OUT WAFER LEVEL PACKAGE TYPE SEMICONDUCTOR PACKAGE AND PACKAGE ON PACKAGE TYPE SEMICONDUCTOR PACKAGE INCLUDING THE SAME

CROSS-REFERENCE TO RELATED APPLICATION

This application claims priority under 35 U.S.C. § 119 to Korean Patent Application No. 10-2016-0116579 filed on Sep. 9, 2016 in the Korean Intellectual Property Office, the disclosure of which is hereby incorporated by reference in its entirety.

BACKGROUND

1. Field

Example embodiments of the present disclosure relate to a semiconductor package, more specifically, a fan out wafer level package type semiconductor package and a package on package type semiconductor package including the same.

2. Description of the Related Art

As the electronics industry has developed, semiconductor devices have been rapidly down-scaled and made lighter. In addition, according to a development of mobile devices, small and multifunctional semiconductor devices have been demanded.

Accordingly, to provide a multifunctional semiconductor package, a package on package (POP) type semiconductor package, in which an upper semiconductor package is stacked on a lower package having a different function from the upper semiconductor package, has been studied. Additionally, in the case where an upper package of a POP type semiconductor package is larger than a lower package of the POP type semiconductor package, a fan out wafer level package (FOWLP) has been proposed as the lower package of the POP type semiconductor package.

SUMMARY

Example embodiments of the inventive concepts provide a FOWLP type semiconductor package and a POP type semiconductor package including a FOWLP type semiconductor package, which may result in greater reliability of an electrical connection between a lower package and an upper package.

According to example embodiments of the inventive concepts, a package on package type semiconductor package may include a first package, wherein the first package may include a printed circuit board (PCB) substrate having a first surface and a second surface opposite to the first surface, wherein the PCB substrate may include a plurality of base layers and a cavity penetrating the plurality of base layers, a first semiconductor chip in the cavity, wherein the first semiconductor chip may have an active surface and an inactive surface opposite to the active surface, a redistribution structure on the first surface of the PCB substrate and on the active surface of the first semiconductor chip, a first cover layer covering the redistribution structure, and a second cover layer covering the second surface of the PCB substrate and the inactive surface of the first semiconductor chip, and a second package on the first package, wherein the second package may be positioned on the second cover layer of the first package and may include a second semiconductor chip. The redistribution structure may include a first sub-insulating interlayer on the active surface of the first semiconductor chip and on the first surface of the PCB substrate, a first via layer penetrating the first sub-insulating interlayer, a first wiring layer on the first sub-insulating interlayer, at least a second sub-insulating interlayer on the first sub-insulating interlayer covering at least a portion of the first wiring layer, a second via layer penetrating the second sub-insulating interlayer, and a second wiring layer on the second sub-insulating interlayer. The first cover layer, the second cover layer and the first sub-insulating interlayer may be formed of a same material.

According to example embodiments of the inventive concepts, a fan out wafer level package type semiconductor package may include a substrate having a first surface and a second surface opposite to the first surface, wherein the substrate may include a plurality of base layers, first connection pads on the first surface and second connection pads on the second surface, a plurality of conductive vias penetrating the respective ones of the plurality of base layers to electrically connect the first connection pads to the second connection pads, and a cavity penetrating the plurality of base layers and spaced apart from the plurality of conductive vias, the first connection pads and the second connection pads, a semiconductor chip in the cavity spaced apart from an inner sidewall of the cavity, wherein the semiconductor chip may include a first pad on an active surface of the semiconductor chip, a redistribution structure on the first surface of the substrate and the active surface of the semiconductor chip, a first cover layer covering the redistribution structure, and a second cover layer covering an inactive surface of the semiconductor chip and the second surface of the substrate. The redistribution structure may include a first sub-insulating interlayer on the first surface of the substrate and on the active surface of the semiconductor chip, at least one second sub-insulating interlayer on the first sub-insulating interlayer, a first via layer penetrating the first sub-insulating interlayer, a second via layer penetrating each of the second sub-insulating interlayer. The first cover layer, the second cover layer and the first sub-insulating interlayer may be formed of the same material.

According to some embodiments, a semiconductor package includes a redistribution structure. The redistribution structure includes a plurality of insulating interlayers, a first surface, and a second surface opposite the first surface. First pads at the first surface are connected to external package connection terminals, and each insulating interlayer includes a plurality of conductive vias passing therethrough, each conductive via connected to a respective conductive via of another insulating interlayer and connected to a respective first pad. The semiconductor package further includes a first semiconductor chip and a substrate disposed on the second surface of the redistribution structure, wherein the first semiconductor chip is formed in a cavity of the substrate and has a first surface facing the redistribution structure and a second surface opposite the first surface. The semiconductor package further includes a first cover layer covering the first surface of the redistribution structure, a second cover layer covering the second surface of first semiconductor chip, a first sub-insulating layer, which is one of the insulating interlayers of the redistribution structure, covering the first surface of the semiconductor chip, and a second semiconductor chip formed above the first semiconductor chip and on the substrate. The first cover layer, second cover layer, and first sub-insulating layer each have the same coefficient of thermal expansion.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
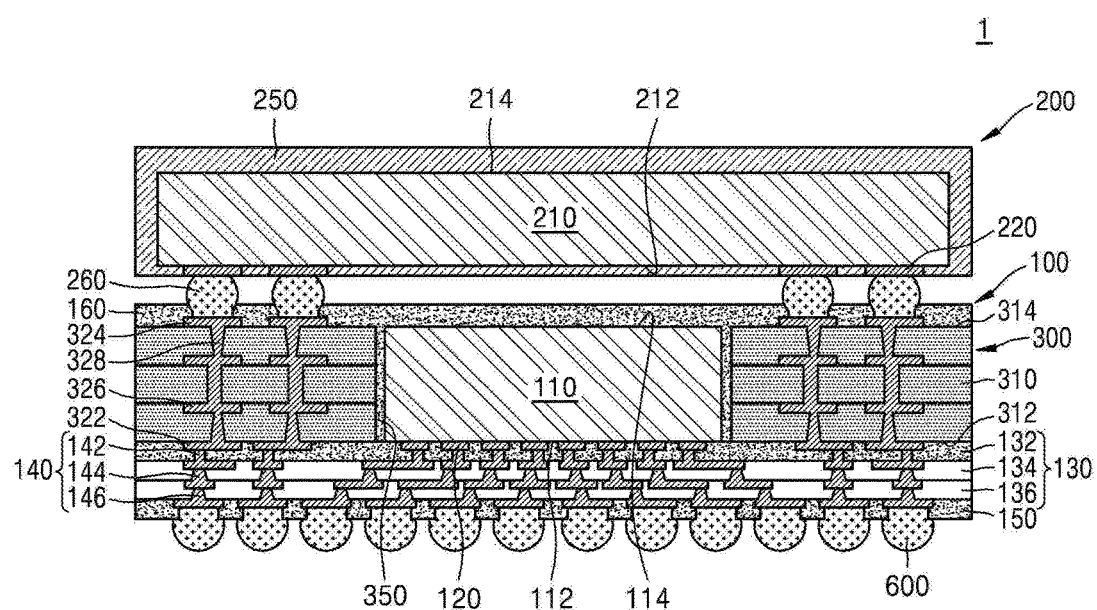
FIG. 1 is a cross-sectional view illustrating a semiconductor package according to an example embodiment.

FIG. 1 is a cross-sectional view illustrating a semiconductor package according to an example embodiment.

Referring to FIG. 1, a semiconductor package 1 may include a lower package 100 and an upper package 200. For example, the semiconductor package 1 may be a package on a package (POP) type semiconductor package in which the upper package 200 is disposed on the lower package 100. The lower package 100 may be, e.g., a fan out wafer level package (FOWLP) type semiconductor package. A semiconductor package may be described more generally as a semiconductor device. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

The lower package 100 may include a printed circuit board (PCB) substrate 300 and a first semiconductor chip 110 buried in the PCB substrate 300 (e.g., formed in a recess or opening, also described as a cavity, in the PCB substrate 300).

The first semiconductor chip 110 may include a semiconductor substrate, e.g., a silicon substrate. In some embodiments, the semiconductor substrate may include a semiconductor material such germanium (Ge) or a semiconductor compound such as silicon carbide (SiC), gallium arsenide (GaAs), indium arsenide (InAs) and indium phosphide (InP). In other embodiments, the semiconductor substrate may be a silicon on insulator (SOI) substrate. For example, the semiconductor substrate may include a buried oxide layer. The semiconductor substrate may include a conductive region, e.g., a well doped with impurities. The first semiconductor chip 110 may include a variety of isolation structures such as a shallow trench isolation (STI) structure in the semiconductor substrate. The first semiconductor chip 110 may be a die formed from a wafer, and may include an integrated circuit.

The first semiconductor chip 110 may have an active surface 112 and an inactive surface 114 opposite to the active surface 112.

The first semiconductor chip 110 may include a plurality of individual devices of various kinds formed adjacent to or on the active surface 112. The plurality of individual devices may include various microelectronic devices, e.g., a metal-oxide-semiconductor field effect transistor (MOSFET) such as a complementary metal-oxide semiconductor (CMOS) transistor, a system large scale integration (LSI), an image sensor such as a CMOS imaging sensor, a micro-electro-mechanical system (MEMS), an active device or a passive device. In some embodiments, the individual devices may be electrically connected to the conductive region of the semiconductor substrate of the first semiconductor chip 110. The first semiconductor chip 110 may include a conductive line and/or a conductive plug connecting the conductive region in the semiconductor substrate to the individual devices or connecting at least two of the individual devices. The individual devices may each be electrically separated from neighboring other individual devices by at least one insulating layer.

The first semiconductor chip 110 may include a first pad 120 on the active surface 112. The first pad 120 may be one of a plurality of pads 120 disposed on the active surface 112. The first pad 120 may be electrically connected to the individual devices. Various elements will be described herein in the singular, but as can be seen from the figures, are included in plural in the various embodiments (e.g., pads, vias, connection terminals, etc.). The first pad 120, may have a flat external surface, and may connect to an integrated circuit within the first semiconductor chip 110 to transmit signals to and from the integrated circuit of first semiconductor chip 110. The other pads described herein may also have flat external surfaces and may transmit signals to or from a chip or substrate to which they are connected.

In some embodiments, the first semiconductor chip 110 may include a central processor unit (CPU), a microprocessor unit (MPU), a graphic processor unit (GPU) or an application processor (AP). In other embodiments, the first semiconductor chip 110 may be a controller to control a second semiconductor chip 210 described later.

The PCB substrate 300 may be a multilayer PCB substrate in which a plurality of base layers 310 are stacked on top of each other. In some embodiments, the plurality of base layers 310 may include a phenolic resin, an epoxy resin and/or a polyimide. For example, the plurality of base layers 310 may include at least one of a frame retardant 4 (FR4), a tetrafunctional epoxy, a polyphenylene ether, an epoxy/polyphenylene oxide, a bismaleimide triazine (BT), a thermount, a cyanate ester, a polyimide and a liquid crystal polymer.

The PCB substrate 300 may have a first surface 312 (e.g., a first surface of the plurality of base layers 310) and a second surface 314 (e.g., a second surface of the plurality of base layers 310) opposite to the first surface 312. The PCB substrate 300 may include a first connection pad 322 on the first surface 312 and a second connection pad 324 on the second surface 314. The first connection pad 322 and the second connection pad 324 may each be one of a plurality of connection pads 322 and 324. The PCB substrate 300 may include inner wirings 326 between the plurality of base layers 310 and a plurality of conductive vias 328 which each penetrate each of the plurality of base layers 310. The inner wirings 326 and the plurality of conductive vias 328 may electrically connect the first connection pad 322 to the second connection pad 324. In some embodiments, a wiring pattern that connects the first connection pad 322 and/or the second connection pad 324 to some of the plurality of conductive vias 328 may be further disposed on the first surface 312 and/or the second surface 314.

The first connection pad 322, the second connection pad 324, the inner wirings 326 and/or the wiring pattern may include, e.g., an electrolytically deposited copper foil, a stainless steel foil, an aluminum foil, ultra-thin copper foils, sputtered copper and/or copper alloys. The conductive vias 328 may include, e.g., copper, nickel, a stainless steel and/or beryllium copper.

The PCB substrate 300 may include a cavity 350 passing through the plurality of base layers 310. The cavity 350 may be spaced from the first connection pad 322, the second connection pad 324, the inner wirings 326 and the plurality of conductive vias 328. The cavity 350 may be positioned at a central region of the PCB substrate 300. The first semiconductor chip 110 may be disposed in the cavity 350. A cross-sectional area of the cavity 350 may be larger than a cross-sectional area of the first semiconductor chip 110. In some embodiments, the first semiconductor chip 110 may be spaced apart from inner sidewalls of the cavity 350. In some embodiments, a depth of the cavity 350 and a total thickness of the plurality of the base layers 310 may be equal to or greater than a thickness of the first semiconductor chip 110.

The active surface 112 of the first semiconductor chip 110 may be coplanar with the first surface 312 of the PCB substrate 300. The first pad 120 of the first semiconductor chip 110 may be positioned at the same level as the first connection pad 322 of the PCB substrate 300.

A redistribution structure 130 and 140 may be disposed on the active surface 112 of the first semiconductor chip 110 and the first surface 312 of the PCB substrate 300. The redistribution structure 130 and 140 may include an insulating interlayer 130 and a redistribution pattern 140. The redistribution structure may also be described as a redistribution substrate. The insulating interlayer 130 may include a plurality of sub-insulating interlayers 132, 134 and 136 that are sequentially stacked. The redistribution pattern 140 may include a multilayer structure in which a plurality of sub-redistribution patterns 142, 144 and 146 are sequentially stacked. The plurality of sub-redistribution patterns 142, 144 and 146 may each include a corresponding one of via layers 142V, 144V and 146V and a corresponding one of wiring layers 142P, 144P and 146P (refer to FIGS. 6A to 6P), wherein the via layers are conductive patterns extending vertically through an insulating layer to connect two conductive components vertically separated by a particular distance, and the wiring layers are conductive patterns extending horizontally within an insulating layer to redistribute signals or voltage horizontally within the package.

As shown in FIG. 1, the insulating interlayer 130 may include first to third sub-insulating interlayers 132, 134 and 136 and the redistribution pattern 140 may include first to third sub-redistribution patterns 142, 144 and 146, but example embodiments of the present inventive concepts are not limited thereto. In some embodiments, the insulating interlayer 130 may include two or four or more sub-insulating interlayers and the redistribution pattern 140 may include two or four or more sub-redistribution patterns. The first sub-insulating interlayer 132 may contact the first surface 312 of the PCB substrate 300 and the active surface 112 of the first semiconductor chip 110.

A first cover layer 150, also described as a passivation layer, may be formed on the redistribution structure 130 and 140. The first cover layer 150 may expose a portion of the redistribution pattern 140. For example, as shown in FIG. 6N, the first cover layer 150 may expose a portion of a third wiring layer 146p that is a part of the third sub-redistribution pattern 146 that is farthest away from the PCB substrate 300 among the sub-redistribution patterns 142, 144 and 146 of the redistribution pattern 140. The portion of third wiring layer 146p exposed by the first cover layer 150 may be defined or referred to as an external connection pad of the semiconductor package 1, as it is for connecting between the semiconductor package 1 and a device or component external to the semiconductor package 1 (e.g., through an external connection terminal 600 such as described in more detail later).

The redistribution pattern 140 may electrically connect the first connection pad 322 of the PCB substrate 300 and the first pad 120 of the first semiconductor chip 110 to the third wiring layer 146p corresponding to the external connection pad of the first semiconductor package 1. In some embodiments, some of the redistribution pattern 140 may electrically connect the first connection pad 322 of the PCB substrate 300 to the first pad 120 to the first semiconductor chip 110.

A second cover layer 160 may be formed on the inactive surface 114 of the first semiconductor chip 110 and the second surface 314 of the PCB substrate 300. The second cover layer 160 may expose a portion of the second connection pad 324. The second cover layer 160 may fill a space in the cavity 350, in which the first semiconductor chip 110 is not disposed. For example, the second cover layer 160 may fill a gap between the inner sidewalls of the cavity 350 and sidewalls of the first semiconductor chip 110.

In one embodiment, the first and second cover layers 150 and 160 may be formed of the same material. The first and second cover layers 150 and 160 may formed of, e.g., a hydrocarbon ring compound containing a filler (refer to 150F of FIG. 7E, or 160F of FIG. 7F). In some embodiments, the first and second cover layers 150 and 160 may be formed of a hydrocarbon ring compound containing a filler of 10 wt % to 70 wt %. The filler may be a $SiO_2$ filler. In some embodiments, the filler may include a $SiO_2$ filler and an organic cushion filler. The filler may have an average size (e.g., average height above a surface on which it is formed, or average thickness in a direction perpendicular to the surface on which it is formed) of less than 5 μm, though the size may be smaller on the inner sidewalls of the cavity 350 than on the active surface 112 of the first semiconductor chip 110 and first surface 312 of the PCB substrate 300 and the inactive surface 114 of the first semiconductor chip 110 and second surface 314 of the PCB substrate 300. In some embodiments, the filler may be formed of the $SiO_2$ filler having the average size of about 1 μm and the organic cushion filler having the average size of about 0.5 μm. In other embodiments, the first and second cover layers 150 and 160 may be formed of ajinomoto build-up film (ABF).

At least one of the first to third sub-insulating interlayers 132, 134 and 136 may be formed of a different material from the others. In some embodiments, the first sub-insulating interlayer 132 may be formed of a different material from the second and third sub-insulating interlayers 134 and 136. For example, the first sub-insulating interlayer 132 may have a different composition (including, e.g., one or more different materials, compounds, or combinations thereof) from the second and third sub-insulating interlayers 134 and 136. For discussion purposes, particularly where the second and third sub-insulating interlayers 134 and 136 have the same composition, each of the second and third sub-insulating interlayers 134 and 136 may be referred to as a second sub-insulating layer (e.g., such that there are a plurality of second sub-insulating layers).

Figure 7A:
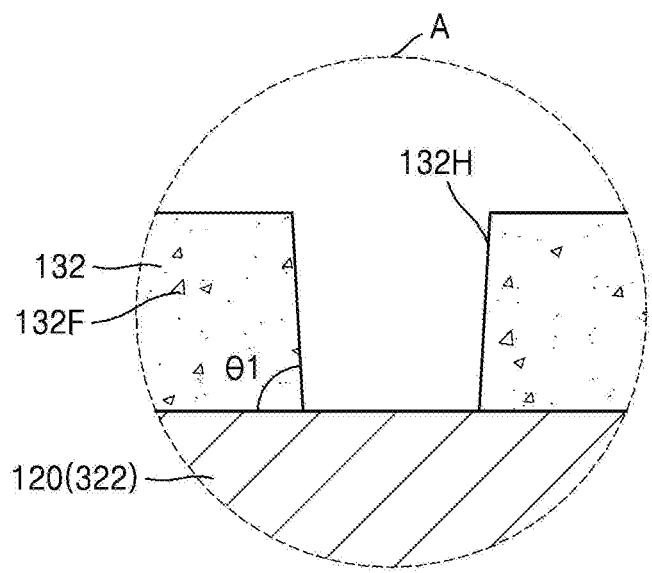
FIGS. 7A to 7F are enlarged views of portions illustrating a method of manufacturing a semiconductor package according to an example embodiment.
Figure 7B:
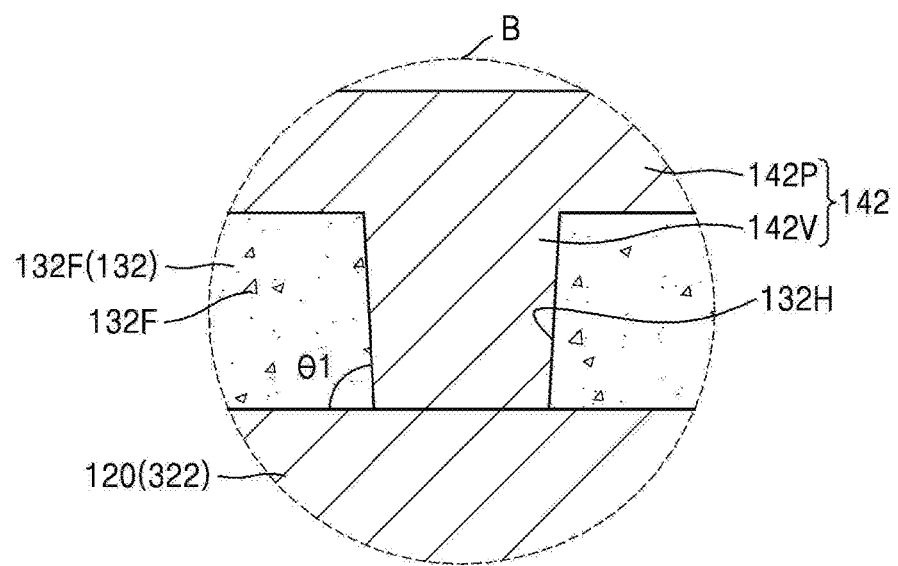

The first sub-insulating interlayer 132 may be formed of, e.g., a hydro carbon ring compound containing a filler (refer to 132F of FIGS. 7A and 7B). In some embodiments, the first sub-insulating interlayer 132 may be formed of the same material (e.g., may have the same composition) as the first and second cover layers 150 and 160. The first sub-insulating interlayer 132 may be formed of, e.g., ABF.

The second and third sub-insulating interlayers 134 and 136 may be formed of a filler-free resin. For example, the second and third sub-insulating interlayers 134 and 136 may be formed of a photo-imageable dielectric (PID) material. In some embodiments, the second and third sub-insulating interlayers 134 and 136 may be formed of an epoxy or a polyimide. The second and third sub-insulating interlayers 134 and 136 may be formed, for example, by a coating process and a curing process.

The first through third sub-redistribution patterns 142, 144 and 146 may include, e.g., copper, nickel, a stainless steel or copper alloy such as beryllium-copper. As shown in FIGS. 6A to 7F, the first via layer 142V and the first wiring layer 142P that constitute the first sub-redistribution pattern 142 may be integrally coupled to each other, the second via layer 144V and the second wiring layer 144P that constitute the second sub-redistribution pattern 144 may be integrally coupled to each other, and the third via layer 146V and the third wiring layer 146P that constitute the third sub-redistribution pattern 146 may be integrally coupled to each other. However the first via and first wiring layers 142V and 142P may not be integrally coupled to the second via and second wiring layers 144V and 146V, which may not be integrally coupled to the third via and third wiring layers 146V and 146P. For discussion purposes, particularly where the second and third via layers 144V and 146V pass through sub-insulating interlayers 134 and 136 having the same composition, each of the second and third via layers 146V and 146P may be referred to as a second via layers (e.g., such that there are a plurality of second via layers).

In some embodiments, the first via layer 142V may have a vertical profile different from vertical profiles of the second and third via layers 144V and 146V. For example, each conductive via of the first via layer 142V may have a different vertical profile from a respective conductive via of the second via layer 144V and the third via layer 146V connected thereto. For example, a sidewall slope angle of a first conductive via of the first via layer 142V (e.g., with respect to a horizontal plane) may be greater than a sidewall slope angle of a respective conductive via of each of the second and third via layers 144V and 146V. In some embodiments, vias of the first via layer 142V may have a substantially constant width from top to bottom thereof, and vias of the second and third via layers 144V and 146V may each have a shape tapering in a direction away from the respective second and third wiring layers 144P and 146P (or the vias of the second and third via layers 144V and 146V may respectively have a width decreasing away from the respective second and third wiring layers 144P and 146P).

The first via layer 142V may have a more uniform vertical profile, and one closer to being perpendicular to the horizontal plane, than the second and third via layers 144V and 146V. Hereinafter, these layers will be described in detail with reference to FIGS. 7A to 7F

A package connection terminal 260 (which may be one of a plurality of package connection terminals 260) may be attached on the second connection pad 324 of the PCB substrate 300. The package connection terminal 260, also described as an internal connection terminal or internal package connection terminal, may include a conductive terminal, e.g., a solder ball or a bump. The package connection terminal 260 may electrically connect the lower package 100 to the upper package 200.

The upper package 200 may be attached on the lower package 100 by the package connection terminal 260 therebetween. The upper package 200 may include a second semiconductor chip 210. The second semiconductor chip 210 may include a second pad 220 on a bottom surface (e.g., an active surface) 212 of the second semiconductor chip 210. The second pad 220 may be one of a plurality of pads 220.

The second semiconductor chip 210 may be, e.g., a memory chip. The second semiconductor chip 210 may be, e.g., a volatile memory device such as a dynamic random access memory (DRAM) or a static random access memory (SRAM), or a non-volatile memory device such as a phase change random access memory, a magnetoresistive random access memory, a ferroelectric random access memory or a resistive random access memory. The second semiconductor chip 210 may be a single semiconductor chip, but a stack of chips including the second semiconductor chip 210 may also be included in place of a single second semiconductor chip 210. In some embodiments, the upper package 200 may further include a controller chip to control the second semiconductor chip 210 or a stack of second semiconductor chips.

The upper package 200 may include a molding layer 250 exposing the second pad 220 and covering at least a portion of the second semiconductor chip 210, and may include the package connection terminals 260. The molding layer 250 may be formed, for example, of an epoxy molding compound (EMC). The package connection terminals 260 may electrically connect the second connection pad 324 to the second pad 220. In some embodiments, a gap may be formed between the second cover layer 160 and the molding layer 250 at the bottom of the second semiconductor chip 210. The semiconductor package 1 may be a POP type semiconductor package in which the upper package 200 is disposed on the FOWLP type lower package 100 to be electrically connected to by the package connection terminals 260. The upper package 200 may be disposed on the lower package 100 in a manner in which the bottom surface 212 of the second semiconductor chip 210 faces the lower package 100. The molding layer 250 may cover a top surface (or an inactive surface) 214 of the second semiconductor chip 210 shown in FIG. 1, but is not limited thereto. In some embodiments, the molding layer 250 may cover sidewalls of the second semiconductor chip 210 and a portion of the bottom surface 212 of the second semiconductor chip 210 except for the second pad 220 and may expose or cover the inactive surface 214 of the second semiconductor chip 210. Although the second semiconductor chip 210 is given as an example, in other examples, a package including a package substrate and one or more chips may be connected to the PCB substrate 300, in a manner such as shown for the first semiconductor chip 210 in FIG. 1.

An external connection terminal 600, also described as an external package connection terminal may be attached on the third sub-redistribution pattern 146 (e.g., the third wiring layer 146P (refer to FIG. 6O)). The external connection terminal 600 may include a conductive material, such as a solder ball or a bump. The external connection terminal 600 may electrically connect the semiconductor package 1 to an external device.

The semiconductor package 1 according to an example embodiment may have a substantially uniform coefficient of thermal expansion (TCE) because the first cover layer 150 and the second cover layer 160 that are respectively formed on the first and second surfaces 312 and 314 of the PCB substrate 300 are formed of the same material (e.g., have the same composition of materials) and thus have the same CTE. Thus, CTE mismatch between top and bottom portions of the lower package 100 may be reduced. Furthermore, since the first sub-insulating interlayer 132, which may also be made of the same material or composition of materials as the first and second cover layers 150 and 160, is formed in the lower package 100, the CTE mismatch between the top and bottom portions and the inside of the lower package 100 may be further reduced. Accordingly, warpage of the lower package 100 may be reduced or prevented. As a result, reliability deterioration or failure of an electrical connection between the lower package 100 and the upper package 200 due to the warpage may be prevented or reduced.

Additionally, since the first connection pad 322 and the second connection pad 324 of the PCB substrate 300 are electrically connected to each other through the plurality of conductive vias 328 and the inner wirings 326, and the vertical profile of the first via layer 142V formed on the first connection pad 322 and the first pad 120 is improved, the FOWLP type lower package 100 can include more fine pitch patterns. Therefore, improved reliability and miniaturization of the semiconductor package 1 can be achieved.

Figure 2:
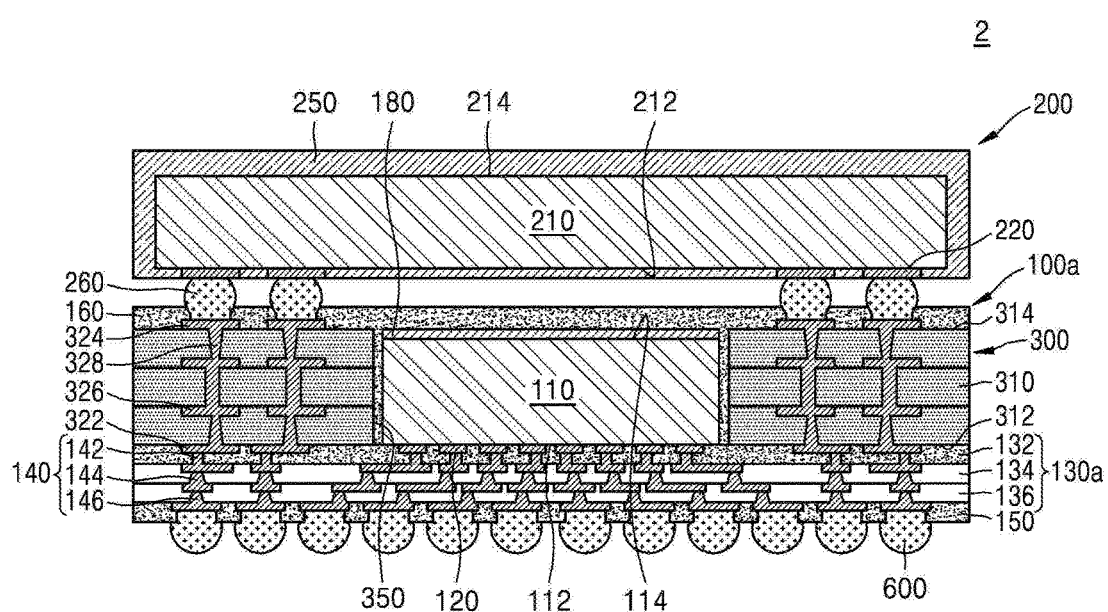
FIG. 2 is a cross-sectional view illustrating a semiconductor package according to an example embodiment.

FIG. 2 is a cross-sectional view illustrating a semiconductor package according to an example embodiment. Hereinafter, descriptions to the same elements as described in the example embodiment of FIG. 1 will be omitted or mentioned briefly.

Referring to FIG. 2, a semiconductor package 2 according to an example embodiment may include a lower package 100a and an upper package 200. For example, the semiconductor package 2 may be a POP type semiconductor package in which the upper package 200 is disposed on the lower package 100a. The lower package 100a may be, e.g., a FOWLP type semiconductor package.

The lower package 100a may include a PCB substrate 300 having a cavity 350 therein and a first semiconductor chip 110 in the cavity 350 of the PCB substrate 300. A depth of the cavity 350 (i.e., a total thickness of a plurality of base layers 310 of the PCB substrate) may be, for example, greater than a thickness of the first semiconductor chip 110.

A die attach layer 180 may be disposed between an inactive surface 114 of the first semiconductor chip 110 and a second cover layer 160. The die attach layer 180 may enhance an adhesive force between the first semiconductor chip 110 and the second cover layer 160. The die attach layer 180 may be formed, for example, by curing a b-stageable die attach film. The die attach layer 180 may include a binding component and a curing component. The biding component may include, e.g., an epoxy resin or a mixture of an epoxy resin and an acrylic polymer resin. The curing component may include, e.g., an epoxy resin, a phenolic curing resin or a phenoxy resin. In some embodiments, a horizontal area of the die attach layer 180 may be equal or similar to a horizontal area of the first semiconductor chip 110.

A first cover layer 150 and a first sub-insulating interlayer 132 may have an increased adhesive force to layers thereunder by an external connection terminal 600 and a redistribution pattern 140, respectively. A second cover layer 160 may include a first portion on which the first semiconductor chip 110 is disposed and a second portion on which a package connection terminal 260 is disposed. An adhesive force of the first portion is relatively low compared to an adhesive force of the second portion. Accordingly, the die attach layer 180 may enhance the adhesive force to the first semiconductor chip 110 at the second portion with the lower adhesive force.

Figure 3:
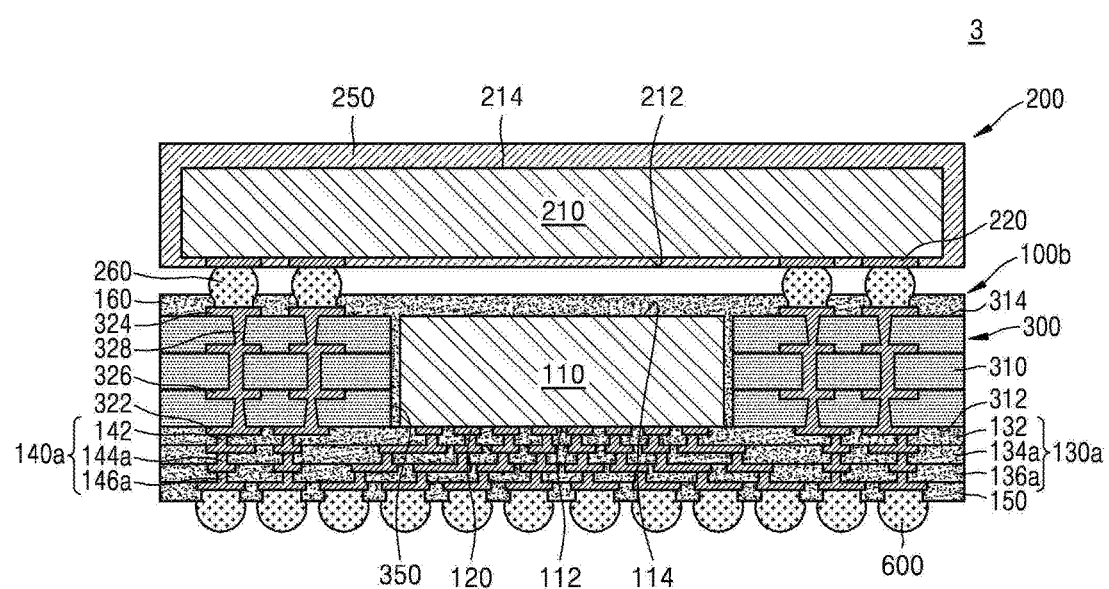
FIG. 3 is a cross-sectional view illustrating a semiconductor package according to an example embodiment.

FIG. 3 is a cross-sectional view illustrating a semiconductor package according to an example embodiment. Hereinafter, descriptions to the same elements as described in the example embodiment of FIG. 1 will be omitted or mentioned briefly.

Referring to FIG. 3, a semiconductor package 3 according to an example embodiment may include a lower package 100b and an upper package 200. The semiconductor package 3 may be, e.g., a POP type semiconductor package in which the upper package 200 is disposed on the lower package 100b. The lower package 100b may be, e.g., a FOWLP type semiconductor package.

A redistribution structure 130a and 140a may be disposed on an active surface 112 of a first semiconductor chip 110 and a first surface 312 of a PCB substrate 300 of the lower package 100b. The redistribution structure 130a and 140a may include an insulating interlayer 130a and a redistribution pattern 140a. The insulating interlayer 130a may include a plurality of sub-insulating interlayers 132, 134a and 136a that are sequentially stacked. The redistribution pattern 140a may include a multilayer structure in which a plurality of sub-redistribution patterns 142, 144a and 146a are sequentially stacked. As shown in FIG. 3, the insulating interlayer 130a may include first to third sub-insulating interlayers 132, 134a and 136a and the redistribution pattern 140a may include first to third sub-redistribution patterns 142, 144a and 146a, but example embodiments of the present invent concepts are not limited thereto. In some embodiments, the insulating interlayer 130a may include two or four or more sub-insulating interlayers and the redistribution pattern 140a may include two or four or more sub-redistribution patterns.

The second and third sub-insulating interlayers 134a and 136a may be formed of the same material as the first sub-insulating interlayer 132. The first to third sub-insulating interlayers 132, 134a and 136a may be formed of the same material as first and second cover layers 150 and 160. The first to third sub-insulating interlayer 132, 134a and 136a may be formed of, e.g., ABF.

Figure 9A:
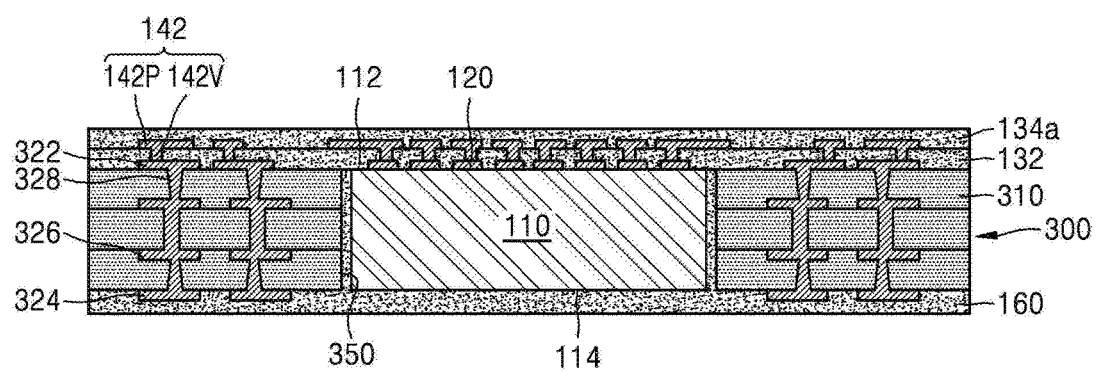
FIGS. 9A to 9C are cross-sectional views and an enlarged view of a portion, illustrating stages of a method of manufacturing a semiconductor package according to an example embodiment.
Figure 9B:
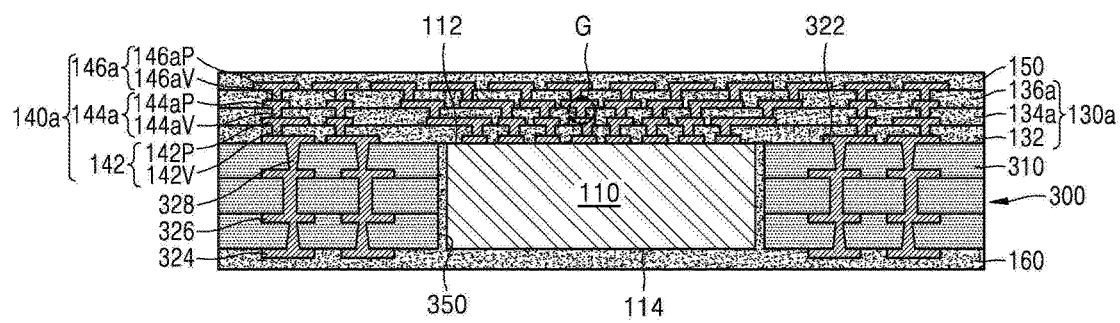
Figure 9C:
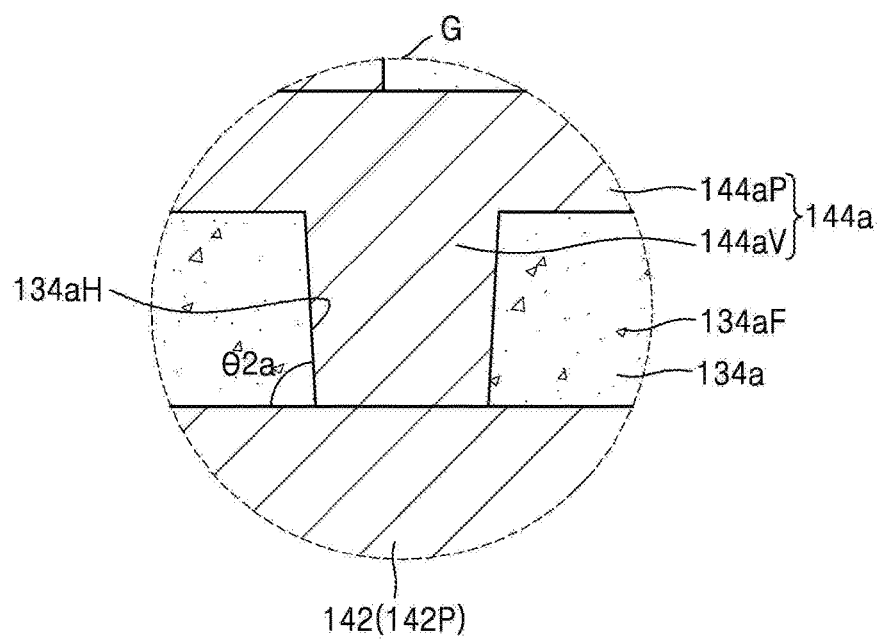

The first sub-redistribution pattern 142 may include a first via layer 142V and a first wiring layer 142P, the second sub-redistribution pattern 144a may include a second via layer 144aV and a second wiring layer 144aP, and the third sub-redistribution pattern 146a may include a third via layer 146aV and a third wiring layer 146aP (refer to FIGS. 9A to 9C). The first via layer 142V and the first wiring layer 142P may be integrally coupled to each other, the second via layer 144aV and the second wiring layer 144aP may be integrally coupled to each other, and the third via layer 146aV and the third wiring layer 146aP may be integrally coupled to each other.

Vertical profiles of vias of the first through third via layers 142V, 144aV and 146aV may be similar to or the same as each other. For example, sidewall slope angles of vias of the first through third via layers 142V, 144aV and 146aV may be similar to or the same as each other. In some embodiments, vias of the first through third via layers 142V, 144aV and 146aV may have a substantially constant width from respective tops to respective bottoms thereof. In some embodiments, vias of the first through third via layers 142V, 144aV and 146aV may have a sidewall slope angle of 80 to 90 degrees relative to the first surface 312 of the PCB substrate 300. Hereinafter, an example will be described in detail with reference to FIGS. 9A to 9C.

The semiconductor package 3 according to an example embodiment may have a relatively constant coefficient of thermal expansion (TCE) because the insulating interlayer 130a, the first cover layer 150 and the second cover layer 160 that are disposed on the first surface 312 and a second surface 314 of the PCB substrate 300 are formed of the same material or composition of materials. Thus, CTE mismatch between top and bottom portions of the lower package 100b may be reduced such that warpage of the lower package 100b may be reduced or prevented. As a result, reliability deterioration or failure of an electrical connection between the lower package 100b and the upper package 200 due to the warpage may be prevented or reduced. Additionally, since the vertical profiles of vias of the first through third via layers 142V, 144aV and 146aV is improved, the FOWLP type lower package 100b can include more fine pitch patterns.

Figure 4:
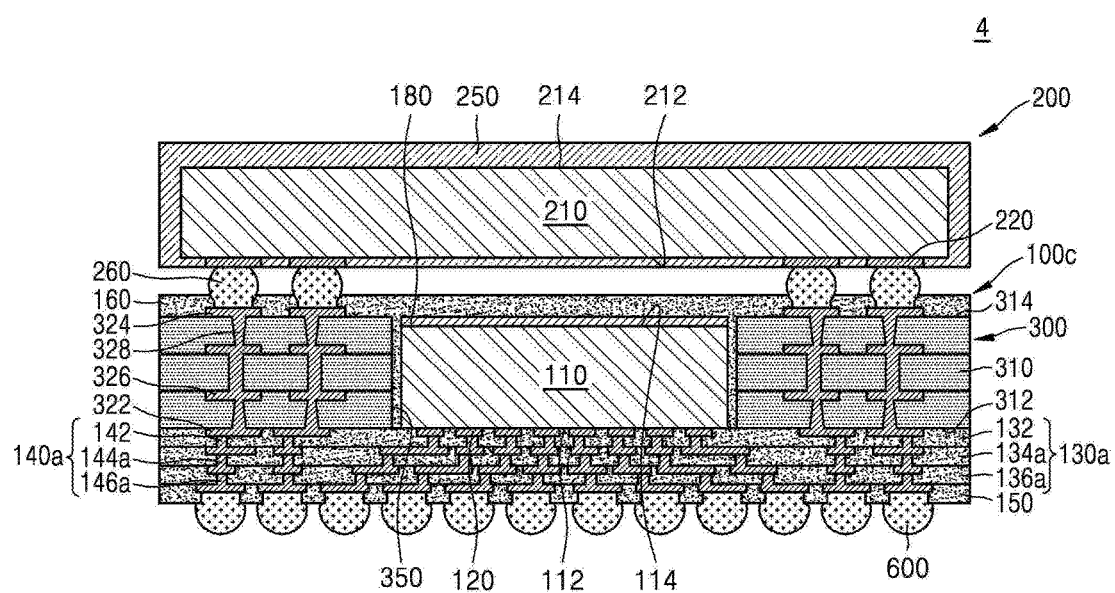
FIG. 4 is a cross-sectional view illustrating a semiconductor package according to an example embodiment.

FIG. 4 is a cross-sectional view illustrating a semiconductor package according to an example embodiment. Hereinafter, descriptions to the same elements as described in the example embodiment of FIGS. 1 through 3 will be omitted or mentioned briefly.

Referring to FIG. 4, a semiconductor package 4 according to an example embodiment may include a lower package 100c and an upper package 200. The semiconductor package 4 may be, e.g., a POP type semiconductor package in which the upper package 200 is disposed on the lower package 100c. The lower package 100c may be, e.g., a FOWLP type semiconductor package.

A die attach layer 180 may be disposed between an inactive surface 114 of a first semiconductor chip 110 and a second cover layer 160. For example, the lower package 100c of the semiconductor package 4 may be the same as the lower package 100b of the semiconductor package 3 of FIG. 3 except for the die attach layer 180 between the inactive surface 114 of the first semiconductor chip 110 and the second cover layer 160.

Figure 5A:
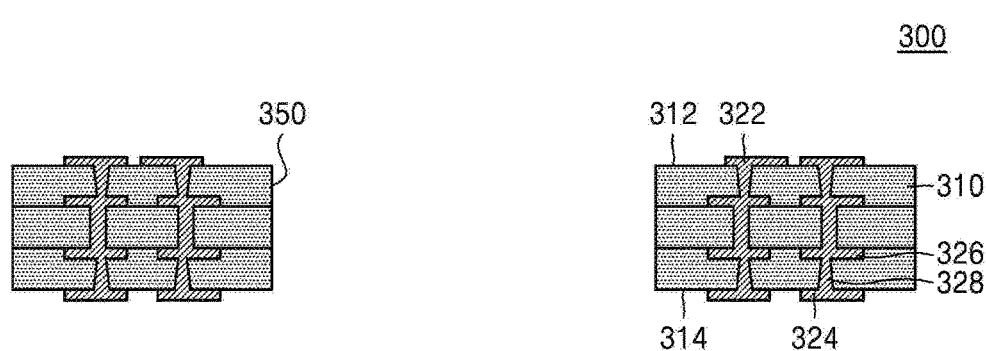
FIGS. 5A and 5B are a cross-sectional view and a plan view illustrating a printed circuit board substrate of a semiconductor package according to an example embodiment, respectively.
Figure 5B:
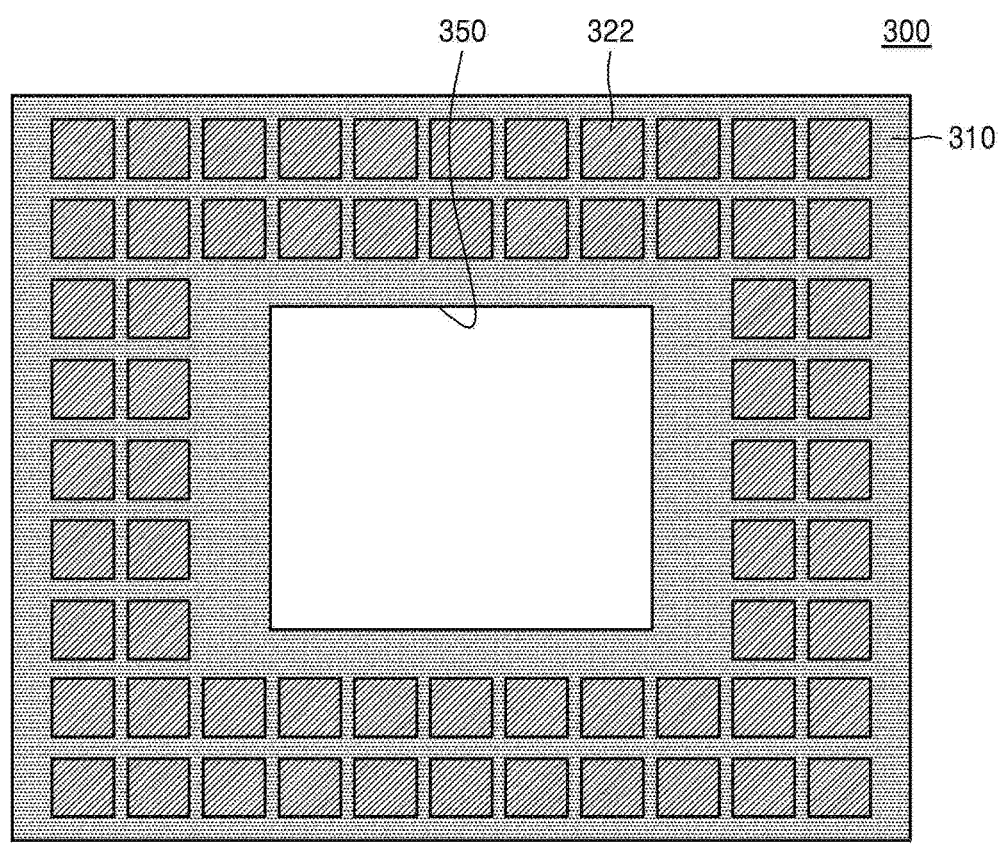

FIGS. 5A and 5B are a cross-sectional view and a plan view illustrating a PCB substrate of a semiconductor package according to an example embodiment, respectively.

Referring to FIGS. 5A and 5B, a PCB substrate 300 may be a multilayer PCB substrate in which a plurality of base layers 310 are stacked on top of each other. The PCB substrate 300 may have a first surface 312 (e.g., a first surface of the plurality of base layers 310) and a second surface 314 (e.g., a second surface of the plurality of base layers 310) opposite to the first surface 312. The PCB substrate 300 may include a first connection pad 322 on the first surface 312 and a second connection pad 324 on the second surface 314. The PCB substrate 300 may include inner wirings 326 between the plurality of base layers 310 (e.g., extending horizontally in or on the PCB substrate 300) and a plurality of conductive vias 328 which each penetrate each of the plurality of base layers 310. The plurality of conductive vias 328 may each electrically connect at least two of the inner wirings 326, the first connection pad 322 and the second connection pad 324. The first connection pad 322 and the second connection pad 324 may be electrically connected by the plurality of conductive vias 328 and the inner wirings 326 that are positioned at different levels.

The PCB substrate 300 may include a cavity 350 penetrating a central portion of the plurality of base layers 310 from the first surface 312 to the second surface 314. The cavity 350 may be spaced apart from the first connection pad 322, the second connection pad 324, the plurality of conductive vias 328 and the inner wirings 326. In some embodiments, the cavity 350 may have a tetragonal shape in plan view. A cross-sectional area and/or a horizontal area of the cavity 350 may be larger than a cross-sectional area and/or a horizontal area of the first semiconductor chip 110 shown in FIGS. 1 to 4. Volume of the cavity 350 may be larger than volume of the first semiconductor chip 110 shown in FIGS. 1 to 4

Figure 6A:
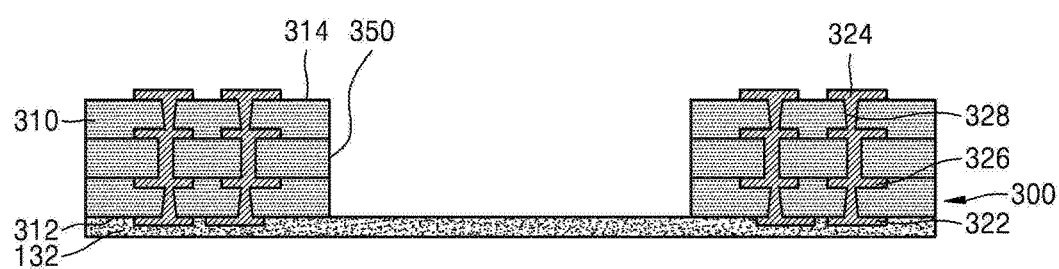
FIGS. 6A to 6P are cross-sectional views illustrating stages of a method of manufacturing a semiconductor package according to an example embodiment.
Figure 6B:
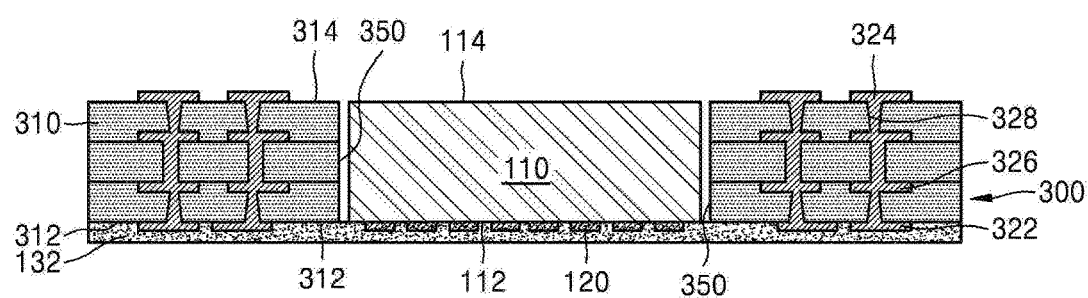
Figure 6C:
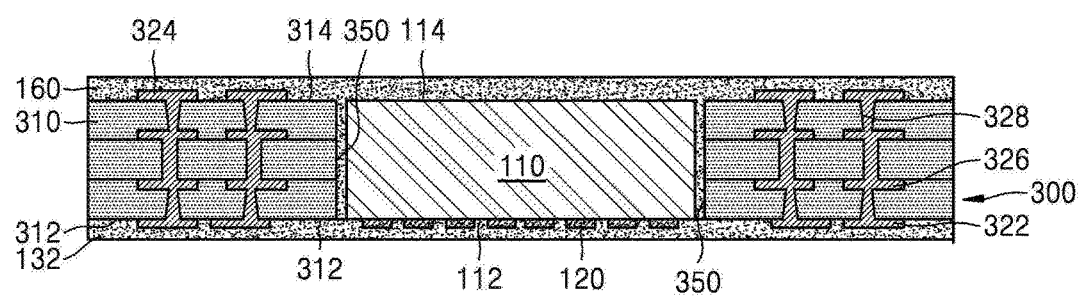
Figure 6D:
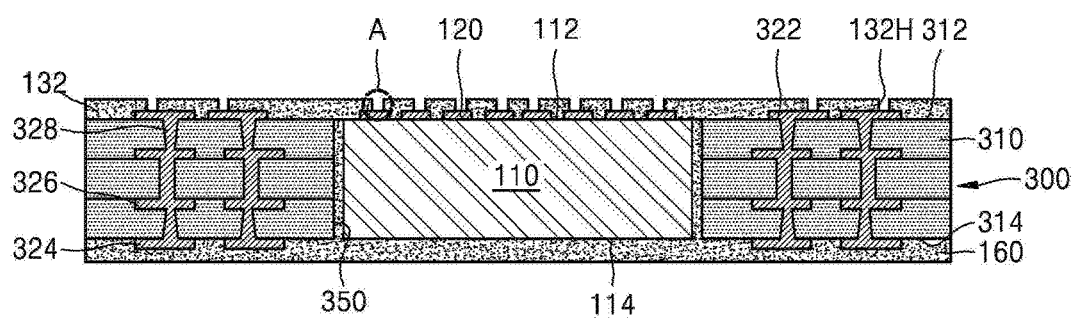
Figure 6E:
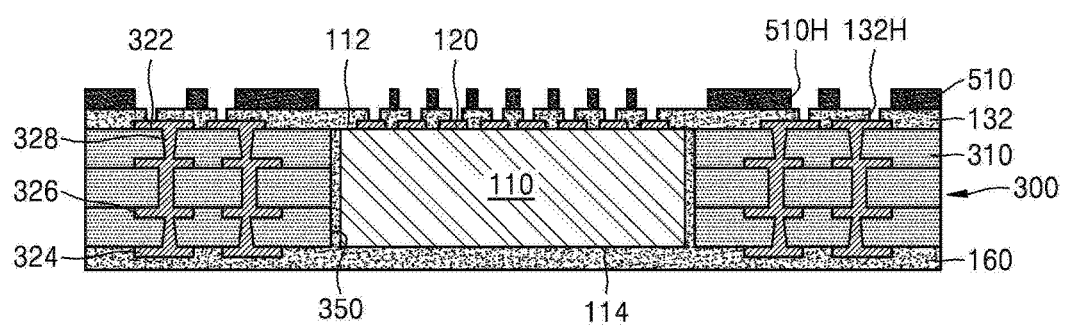
Figure 6F:
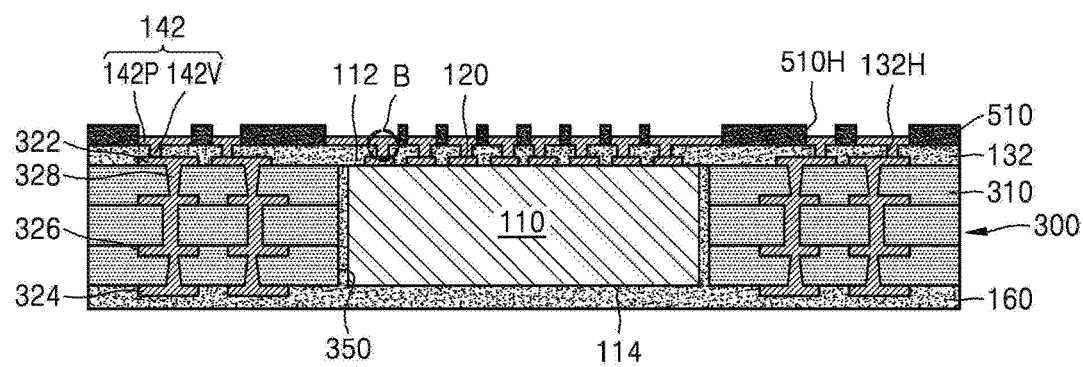
Figure 6G:
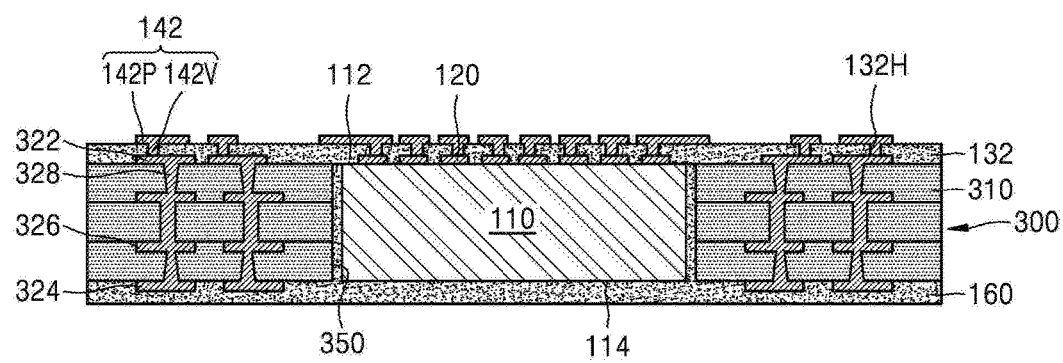
Figure 6H:
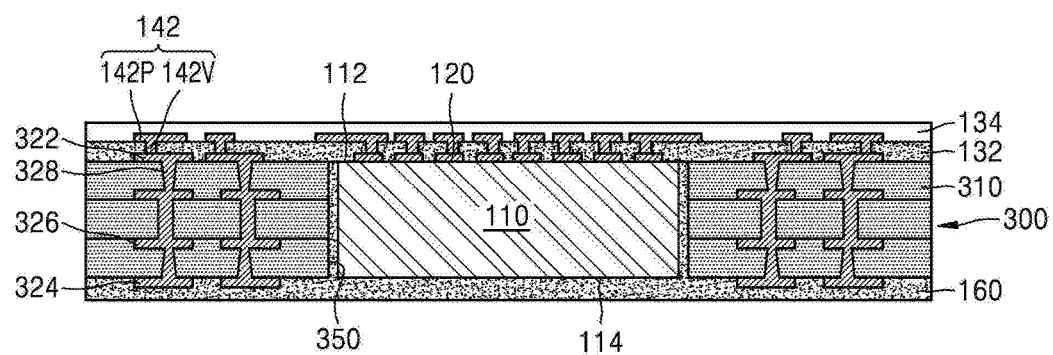
Figure 6I:
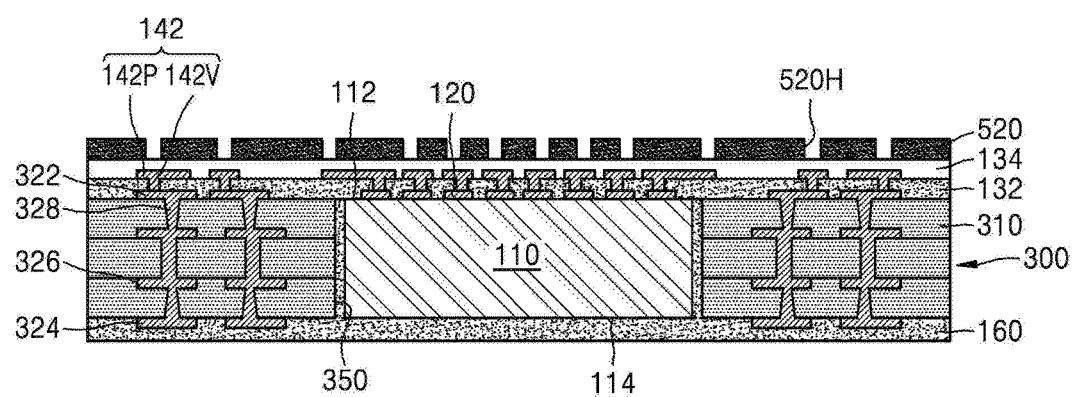
Figure 6J:
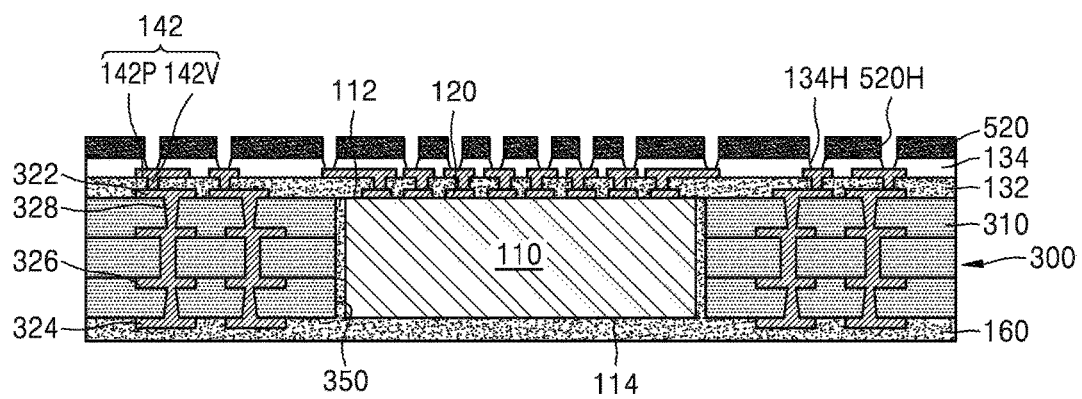
Figure 6K:
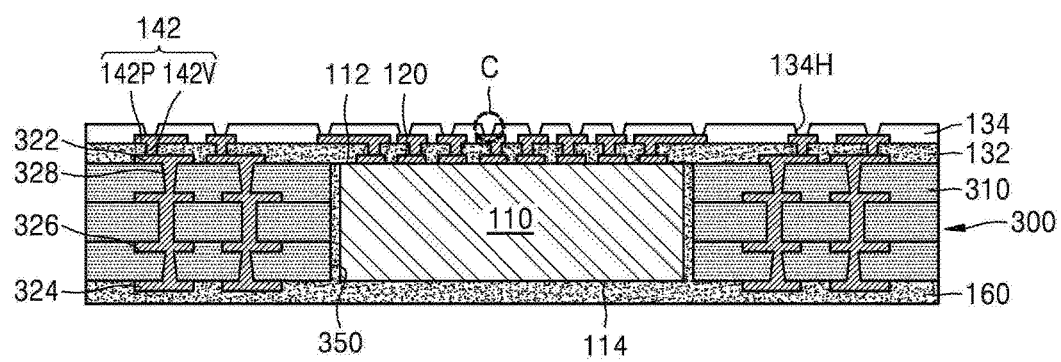
Figure 6L:
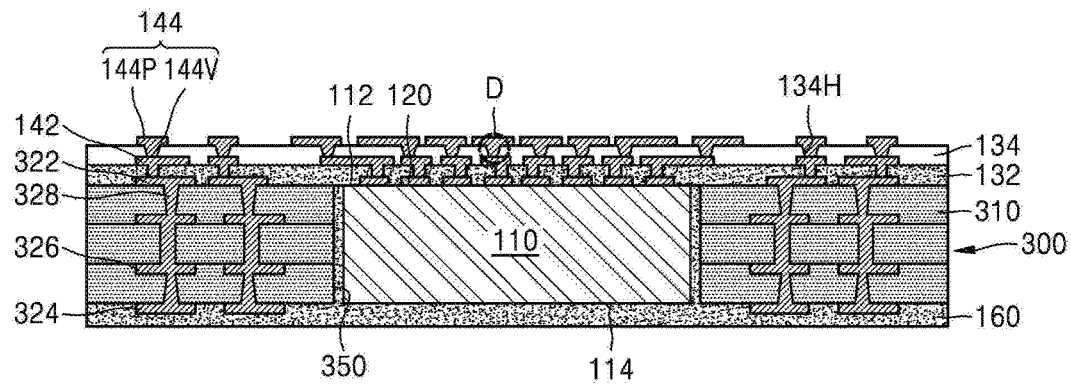
Figure 6M:
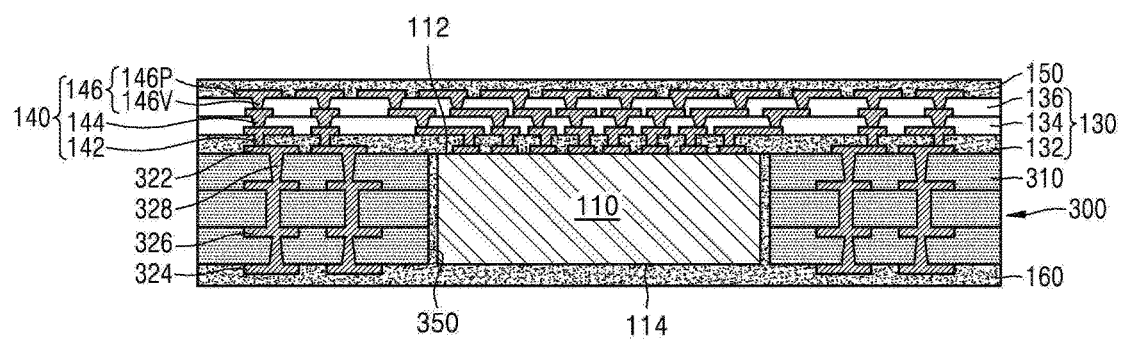
Figure 6N:
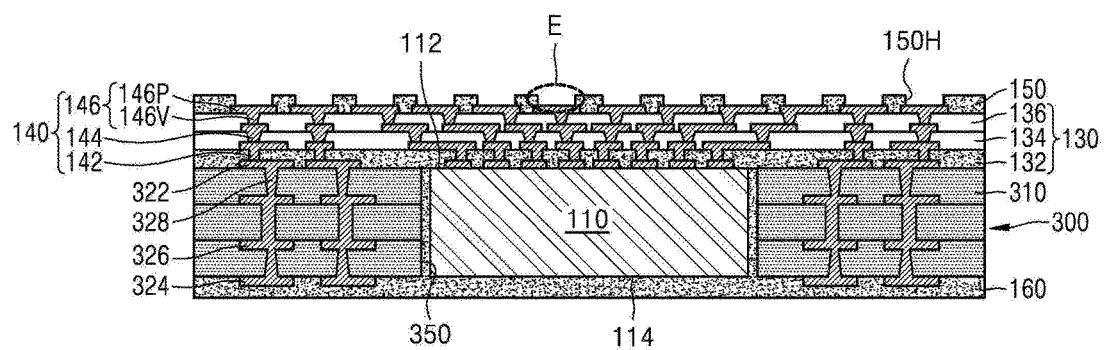
Figure 60:
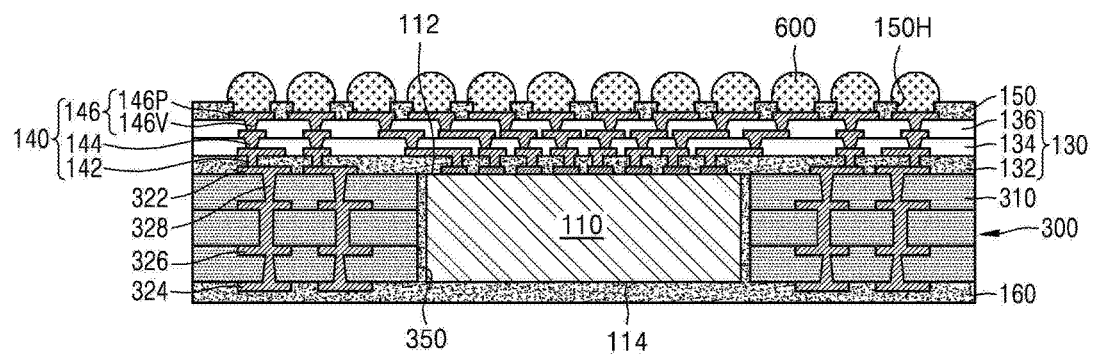
Figure 6P:
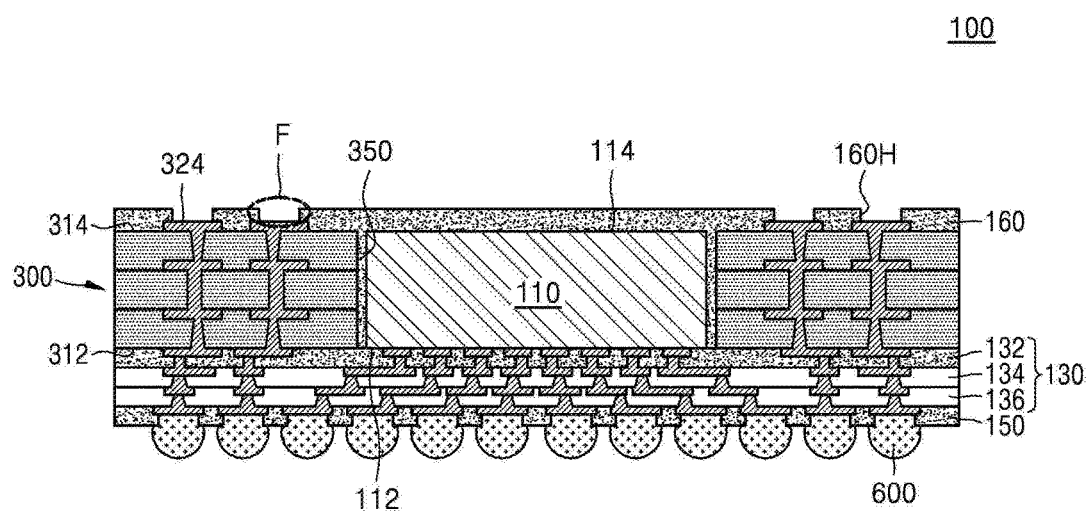

FIGS. 6A to 6P are cross-sectional views illustrating stages of a method of manufacturing a semiconductor package according to an example embodiment. Specifically, FIGS. 6A to 6P are cross-sectional views illustrating stages of a method of manufacturing the semiconductor package 1 according to the example embodiment of FIG. 1.

Referring to FIG. 6A, a PCB substrate 300 as described in FIGS. 5A and 5B may be attached on a first sub-insulating interlayer 132. The PCB substrate 300 may be attached on a first sub-insulating interlayer 132 in such a way that a first surface 312 of the PCB substrate 300 faces the first sub-insulating interlayer 132. The first sub-insulating interlayer 132 may cover the entire first surface 312 of the PCB substrate 300 according to an embodiment. A first connection pad 322 may be completely covered by the first sub-insulating interlayer 132 according to an embodiment. For example, in the case in which a top surface and sidewalls of the first connection pad 322 are exposed on the PCB substrate 300, the first sub-insulating interlayer 132 may completely cover the top surface and the sidewalls of the first connection pad 322. In some embodiments, in the case in which only a top surface of the first connection pad 322 is exposed on the PCB substrate 300, such as an embedded-trace structure (ETS), the first sub-insulating interlayer 132 may completely cover the top surface of the first connection pad 322.

The first sub-insulating interlayer 132 may be formed of, e.g., a hydro carbon ring compound containing a filler (refer to 132F of FIGS. 7A and 7B). In some embodiments, the first sub-insulating interlayer 132 may be formed of a hydrocarbon ring compound containing a filler of 10 wt % to 70 wt %. The filler may be a $SiO_2$ filler. In some embodiments, the filler may include a $SiO_2$ filler and an organic cushion filler. The filler may have an average size of less than 5 μm, for example as discussed previously. In some embodiments, the filler may be formed of the $SiO_2$ filler having the average size of about 1 μm and the organic cushion filler having the average size of about 0.5 μm.

The first sub-insulating interlayer 132 may be formed of ABF and may act as a supporting film to support the PCB substrate 300 and a first semiconductor chip 110 shown in FIG. 6B.

Referring to FIG. 6B, the first semiconductor chip 110 may be disposed in a cavity 350 of the PCB substrate 300 and may be attached on the first sub-insulating interlayer 132 exposed by the cavity 350. The first semiconductor chip 110 may be attached on the first sub-insulating interlayer 132 through the cavity 350 in such a way that an active surface 112 of the first semiconductor chip 110 faces the first sub-insulating interlayer 132. The first semiconductor chip 110 in the cavity 350 may be spaced apart from inner sidewalls of the cavity 350. Thus, a gap may be formed between the inner sidewalls of the cavity 350 and sidewalls of the first semiconductor chip 110.

The first sub-insulating interlayer 132 may completely cover the active surface 112 of the first semiconductor chip 110. A first pad 120 of the first semiconductor chip 110, that is formed on the active surface 112, may be completely covered by the first sub-insulating interlayer 132. In the case in which a top surface and sidewalls of the first pad 120 are exposed, the first sub-insulating interlayer 132 may cover the top surface and the sidewalls of the first pad 120. In some embodiments, in the case in which the sidewalls of the first pad 120 is covered by a protection layer and the top surface thereof is exposed, the first sub-insulating interlayer 132 may cover the top surface of the first pad 120.

The first surface 312 of the PCB substrate 300 may be coplanar with the active surface 112 of the first semiconductor chip 110. The first surface 312 of the PCB substrate 300 and the active surface 112 of the first semiconductor chip 110 may contact a top surface of the first sub-insulating interlayer 132 such that the top surface of the first sub-insulating interlayer 132, the active surface 112 of the first semiconductor chip 110 and the first surface 312 of the PCB substrate 300 may be positioned at the same level.

An inactive surface 114 of the first semiconductor chip 110 may be coplanar with a second surface 314 of the PCB substrate 300 shown in FIG. 6B, but is not limited thereto. In some embodiments, the inactive surface 114 of the first semiconductor chip 110 may be lower than the second surface 314 of the PCB substrate 300, and thus may be positioned in the cavity 350.

Referring to FIG. 6C, a second cover layer 160 may be attached on the second surface 314 of the PCB substrate 300 and the inactive surface 114 of the first semiconductor chip 110. The second cover layer 160 may be opposed to the first sub-insulating interlayer 132. The second cover layer 160 may be formed of a hydrocarbon ring compound containing a filler (refer to 160F of FIG. 7F). The second cover layer 160 may be formed of the same material (e.g., may have the same composition of materials) as the first sub-insulating interlayer 132. The second cover layer 160 may include, e.g., ABF, and may act as a supporting film to support the PCB substrate 300 and the first semiconductor chip 110 during the following process.

The second cover layer 160 may fill a remaining portion of the cavity 350 in which the first semiconductor chip 110 is not disposed. The second cover layer 160 may fill the gap between the inner sidewalls of the cavity 350 and the sidewalls of the first semiconductor chip 110 and may contact the first sub-insulating interlayer 132.

The second cover layer 160 may completely cover and contact the second surface 314 of the PCB substrate 300 and the inactive surface 114 of the first semiconductor chip 110. A second connection pad 324 on the second surface 314 of the PCB substrate 300 may be completely covered (e.g., directly covered) by the second cover layer 160. For example, in the case in which a top surface and sidewalls of the second connection pad 324 are exposed on the PCB substrate 300, the second cover layer 160 may completely cover and contact the top surface and the sidewalls of the second connection pad 324. In some embodiments, in the case in which only a top surface of the second connection pad 324 is exposed on the PCB substrate 300, such as an embedded-trace structure (ETS), the second cover layer 160 may completely cover and contact the top surface of the second connection pad 324.

Referring to FIG. 6D, a resulting structure, in which the first sub-insulating interlayer 132 is attached on the first surface 312 of the PCB substrate 300 and the active surface 112 of the first semiconductor chip 110 and the second cover layer 160 is attached on the second surface 314 of the PCB substrate 300 and the inactive surface 114 of the first semiconductor chip 110, may be turned over, such that the second cover layer 160 is positioned below the PCB substrate 300 and the first sub-insulating interlayer 132 is positioned above the PCB substrate 300.

Next, a portion of the first sub-insulating interlayer 132 may be removed to form first openings 132H exposing the first connection pads 322 of the PCB substrate 300 and the first pads 120 of the first semiconductor chip 110.

The first openings 132H may be formed by, e.g., a laser drilling process. In some embodiments, the first openings 132H may be formed by a laser drilling process using ultraviolet laser or excimer laser. In some embodiments, the first openings 132H may each have a substantially constant width from top to bottom thereof, or if the width changes slightly, it could change in a constant, linear manner. In some embodiment, each first opening 132H may have a sidewall slope angle of 80 to 90 degrees. A shape of the first openings 132H will be described in detail with reference to FIG. 7A.

The first sub-insulating interlayer 132 acting as the supporting film may be used as a part of an insulating interlayer (refer to 130 of FIG. 1) without being removed in the following process. Therefore, a residue of the first sub-insulating interlayer 132, such as a residue of a typical supporting film occurring when a typical supporting film is removed, may be prevented from being generated. As a result, contamination of the first pad 120 and the first connection pad 322 and an increase in a contact resistance between the first connection pad 322 and a first sub-redistribution pattern (refer to 142 of FIG. 6G) due to the residue may be prevented or reduced.

Referring to FIG. 6E, a first mask pattern 510 including a first mask opening 510H may be formed on the first sub-insulating interlayer 132. The first mask pattern 510 may be formed of, e.g., photoresist. A width (e.g., in a horizontal direction) of the first mask opening 510H may be greater than the width of the first opening 132H. The first mask opening 510H may expose the first opening 132H and a portion of the first sub-insulating interlayer 132 around the first opening 132H.

In some embodiments, before forming the first mask pattern 510, a seed layer may be formed to cover the first sub-insulating interlayer 132 and the first the first connection pads 322 of the PCB substrate 300 and the first pads 120 of the first semiconductor chip 110 that are exposed by the first opening 132H.

Referring to FIG. 6F, a first sub-redistribution pattern 142 may be formed to fill at least a portion of the first mask opening 510H and the first opening 132H. The first sub-redistribution pattern 142 may include a first via layer 142V filling the first opening 132H and connected to the first the first connection pad 322 of the PCB substrate 300 and the first pad 120 of the first semiconductor chip 110, and a first wiring layer 142P filling a portion of the first mask opening 510H and coupled to the first via layer 142V. The via layer may include conductive patterns/vias extending vertically through an insulating layer to connect two conductive components vertically separated by a particular distance, and the wiring layer may include conductive patterns/wiring extending horizontally within an insulating layer to redistribute signals or voltage horizontally within the package.

The first sub-redistribution pattern 142 may be formed by, e.g., a plating process. For example, the first sub-redistribution pattern 142 may be formed of copper. In some embodiments, the first sub-redistribution pattern 142 may formed by a plating process using the seed layer as described in FIG. 6E as a seed. For example, the first sub-redistribution pattern 142 may be formed by immersion plating, electroless plating, electroplating or a combination thereof.

Referring to FIG. 6G, after forming the first sub-redistribution pattern 142, the first mask pattern 510 of FIG. 6F may be removed. The first mask pattern 510 may be removed, for example, by an ashing process or a strip process. In some embodiments, after removing the first mask pattern 510, the seed layer described in FIGS. 6E and 6F may be partially removed. The seed layer may be removed by a chemical etching process.

As the first mask pattern 510 is removed, the first via layer 142V of the first sub-redistribution pattern 142 may be disposed in the first openings 132H and the first wiring layer 142P of the first sub-redistribution pattern 142 may be disposed on the first sub-insulating interlayer 132. Since the first via layer 142V and the first wiring layer 142P are formed together by the plating process, the first via layer 142V and the first wiring layer 142P may be integrally formed.

As the first via layer 142V is formed in the first openings 132H, a shape of vias of the first via layer 142V may be similar to the shape of the first openings 132H. In some embodiments, the vias of the first via layer 142V may have a substantially constant width from top to the bottom thereof. In some embodiments, vias of the first via layer 142V may have a sidewall slope angle of 80 to 90 degrees. The shape of the first via layer 142V will be described in detail with reference to FIG. 7B.

Referring to FIG. 6H, a second sub-insulating interlayer 134 may be formed on the first sub-insulating interlayer 132 having the first sub-redistribution pattern 142. The second sub-insulating interlayer 134 may be formed, for example, by curing of a filler-free resin coating.

The second sub-insulating interlayer 134 may be formed of, e.g., a photo-imageable dielectric material. In some embodiments, the second sub-insulating interlayer 134 may be formed of an epoxy or a polyimide.

The second sub-insulating interlayer 134 may completely cover the first sub-insulating interlayer 132 and the first sub-redistribution pattern 142. The second sub-insulating interlayer 134 may completely cover sidewalls and a top surface of the first wiring layer 142P. As used herein, certain layers are described as completely covering certain components or other layers. As can be seen from the various figures, these descriptions may refer to a direct, complete covering (e.g., contacting and covering) of the components.

Referring to FIG. 6I, a second mask pattern 520 including a second mask opening 520H may be formed on the second sub-insulating interlayer 134. The second mask pattern 520 may be formed of, e.g., photoresist. The second mask opening 520H may vertically overlap a portion of the first wiring layer 142P.

Referring to FIG. 6J, after exposing with light a portion of the second sub-insulating interlayer 134 exposed by the second mask opening 520H, the exposed portion of the second sub-insulating interlayer 134 may be removed to form a second opening 134H exposing a portion of the first wiring layer 142P.

In some embodiments, a portion of the second sub-insulating interlayer 134 exposed by the second mask opening 520H may be exposed to ultraviolet light. In some embodiments, the exposed portion of the second sub-insulating interlayer 134 may be removed using solvent.

Referring to FIG. 6K, after forming the second opening 134H, the second mask pattern 520 of FIG. 6J may be removed. The second mask pattern 520 may be removed, for example, by an ashing process or a strip process.

In some embodiments, the second opening 134H may have a downwardly tapered shape. In some embodiments, the second opening 134H may have a sidewall slope angle (e.g., with respect to a horizontal surface) of less than 70 degrees. The shape of the second opening 134H will be described in detail with reference to FIG. 7C.

Referring to FIG. 6L, a second sub-redistribution pattern 144 may be formed by a similar method as described with reference to FIG. 6E through FIG. 6G.

The second sub-redistribution 144 may include a second via layer 144V filling the second openings 134H and connected to the first wiring layer 142P (refer to FIG. 6K), and a second wiring layer 144P disposed on the second sub-insulating interlayer 134 and coupled to the second via layer 144V. The second via layer 144V and the second wiring layer 144P may be formed together by a plating process, and thus the second via layer 144V and the second wiring layer 144P may be integrally formed.

As the second via layer 144V is formed in the second openings 134H, a shape of vias of the second via layer 144V may be similar to the shape of each second opening 134H. Vias of the second via layer 144V may have a downwardly tapered shape. In some embodiments, vias of the second via layer 144V may have a sidewall slope angle (e.g., with respect to a horizontal surface) of less than 70 degrees. The shape of the second via layer 144V may be described in detail with reference to FIG. 7C.

Referring to FIG. 6M, a third sub-insulating interlayer 136 may be formed by a similar method as described with reference to FIGS. 6H to 6K and a third sub-redistribution pattern 146 may be formed by a similar method as described with reference to FIGS. 6E to 6G. As result, a redistribution structure 130 and 140, that includes an insulating interlayer 130 including the first to third sub-insulating interlayers 132, 134 and 136 and a redistribution pattern 140 including the first to third sub-redistribution patterns 142, 144 and 146, may be formed.

The third sub-redistribution pattern 146 may include a third via layer 146V in the third sub-insulating interlayer 136 and connected to the second sub-redistribution pattern 144, and a third wiring layer 146P on the third sub-insulating interlayer 136 and coupled to the third via layer 146V. The third via layer 146V and the third wiring layer 146P may be formed together by a plating process, and thus the third via layer 146V and the third wiring layer 146P may be integrally formed. A shape of the third via layer 146V may be similar to the shape of the second via layer 144V, and thus detailed descriptions thereof may be omitted.

A first cover layer 150 may be attached on the redistribution structure 130 and 140. The first cover layer 150 may be formed, for example, of a hydrocarbon ring compound containing a filler (refer to 150F of FIG. 7E). The first cover layer 150 may be formed of the same material (e.g., may have the same composition) as the second cover layer 160. The first cover layer 150 may be formed of the same material (e.g., may have the same composition) as the first sub-insulating interlayer 132. The first cover layer 150 may be formed of ABF. The first cover layer 150 may completely cover the redistribution structure 130 and 140. For example, the first cover layer 150 may completely cover a top surface and sidewalls of the third wiring layer 146P of the third sub-redistribution pattern 146.

Referring to FIG. 6N, a portion of the first cover layer 150 may be removed to form a third opening 150H exposing a portion of the third wiring layer 146P.

The third opening 150H may be formed by, e.g., a laser drilling process. In some embodiments, the third opening 150H may be formed by a laser drilling process using ultraviolet laser or excimer laser. In some embodiments, the third opening 150H may have a substantially constant width from top to bottom thereof. In some embodiment, the third opening 150H may have a sidewall slope angle of 80 to 90 degrees. A shape of the third opening 150H will be described in detail with reference to FIG. 7E.

Referring to FIG. 6O, an external connection terminal 600 may be attached on the portion of the third wiring layer 146P exposed by the third opening 150H. The external connection terminal 600 may include, e.g., a solder ball or a bump. The external connection terminal 600 may be for electrically connecting to an external device.

Referring to FIG. 6P, a resulting structure, in which the first cover layer 150 and the external connection terminal 600 are formed, may be turned upside down, such that the first cover layer 150 may be positioned below the PCB substrate 300 and the second cover layer 160 may be positioned above the PCB substrate 300.

Next, a portion of the second cover layer 160 may be removed to form a fourth opening 160H exposing the second connection pad 324 of the PCB substrate 300. As a result, a lower package 100 may be formed.

The fourth opening 160H may be formed by, e.g., a laser drilling process. In some embodiments, the fourth opening 160H may be formed by a laser drilling process using ultraviolet laser or excimer laser. In some embodiments, the fourth opening 160H may have a substantially constant width from top to bottom thereof. In some embodiment, the fourth opening 160H may have a sidewall slope angle of 80 to 90 degrees. A shape of the fourth opening 160H will be described in detail with reference to FIG. 7F.

Next, as shown in FIG. 1, an upper package 200 (e.g., an upper semiconductor chip and a molding layer) may be attached to the lower package 100 by a package connection terminal 260, such that a semiconductor package 1 may be formed. In some embodiments, after the package connection terminal 260 is attached on a second pad 220 of the upper package 200, the package connection terminal 260 may be configured to be coupled to the second connection pad 324 of the lower package 100 in the fourth opening 160H. In other embodiments, after the package connection terminal 260 is attached on the second connection pad 324 of the lower package 100 through the fourth opening 160H, the upper package 200 may be attached to the package connection terminal 260 such that the package connection terminal 260 is coupled to the second pad 220 of the upper package 200.

As shown in FIGS. 6N to 6P, after the formation of the third opening 150H and the attachment of the external connection terminal 600, the forming process of the fourth opening 160H and the attaching process of the upper package 200 may be performed, but example embodiments of the present inventive concepts are not limited thereto. In some embodiments, the formation of the fourth opening 160H and the attachment of the upper package 200 may precede the formation of the third opening 150H. In other embodiments, after the formation of the third opening 150H, the forming process of the fourth opening 160H and the attaching process of the upper package 200 may be performed, and then the attaching process of the external connection terminal 600 may be performed.

FIGS. 7A to 7F are enlarged views of portions illustrating a method of manufacturing a semiconductor package according to an example embodiment. Specifically, FIGS. 7A to 7F are enlarged views of portions A, B, C, D, E and F of FIGS. 6D, 6F, 6K, 6L, 6N and 6P, respectively.

Referring to FIGS. 6D and 7A, the first opening 132H may have a width, at a portion thereof near the first pad 120 or the first connection pad 322, that is equal to or slightly less than a width at another portion thereof away from the first pad 120 or the first connection pad 322. Thus, the first opening 132H may have a substantially constant width, and thus may have a relatively good vertical profile. In some embodiments, the first opening 132H may have a first sidewall slope angle $\theta1$ of 80 to 90 degrees (e.g., with respect to a horizontal surface, e.g., of the first pad 120). The first sidewall slope may be substantially constant from a portion of the first opening 132H near the first pad 120 or the first connection pad 322 to another portion of the first opening 132H away from the first pad 120 or the first connection pad 322. The first sub-insulating interlayer 132 may be formed of, e.g., a hydrocarbon ring compound containing a filler 132F.

Referring to FIGS. 6F and 7B, as the first via layer 142V of the first sub-redistribution pattern 142 is formed in the first opening 132H, the shape of the first via layer 142V that forms a first conductive via may be similar to the shape of the first opening 132H. The via of the first via layer 142V may have a width, at a portion thereof near the first pad 120 or the first connection pad 322, that is equal to or slightly less than a width at another portion thereof away from the first pad 120 or the first connection pad 322. For example, the difference in horizontal width between the top and the bottom of the first via passing through the first sub-insulating interlayer 132 may be an amount that is less than 35% of the height of the first sub-insulating interlayer 132, and in some cases is less than 10% or even 5% of the height of the first sub-insulating interlayer 132. According to some embodiments, the via of the first via layer 142V may have a substantially constant width, and thus may have a relatively good vertical profile. In some of the description below, a "via layer," when describing a single instance in a single opening of a sub-insulating layer, refers to a single conductive via passing therethrough. However, a via layer in other discussions may also refer to the entire set of vias formed at a particular layer by a single process.

In some embodiments, the first via layer 142V may have the first sidewall slope angle $\theta1$ of 80 to 90 degrees (e.g., with respect to a horizontal surface). The first sidewall slope may be substantially constant from a portion of the first via layer 142V near the first pad 120 or the first connection pad 322 to another portion of the first via layer 142V away from the first pad 120 or the first connection pad 322. For example, this may be due to the laser method used to form the first opening 132H filled in with the first via layer 142V.

Figure 7C:
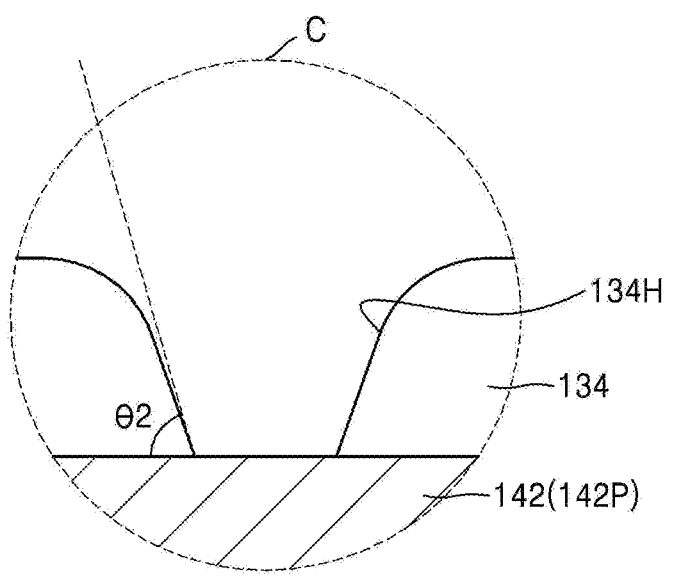

Referring to FIGS. 6K and 7C, the second opening 134H may have a width, at a portion thereof near the first wiring layer 142P of the first sub-redistribution pattern 142, that is less than a width at another portion thereof away from the first wiring layer 142P. Thus, the second opening 134H may have a variable width, and thus may have a variable vertical profile. In some embodiments, the second opening 134H may have a second sidewall slope angle $\theta2$ smaller than the sidewall slope angle $\theta1$ of the first opening 132H (e.g., it may be less than 70 degrees). The second sidewall slope may gradually decrease from a portion of the second opening 134H near the first wiring layer 142P to another portion of the second opening 134H away from the first wiring layer 142P. The second sub-insulating interlayer may 134 may be formed of, e.g., a filler-free resin.

Figure 7D:
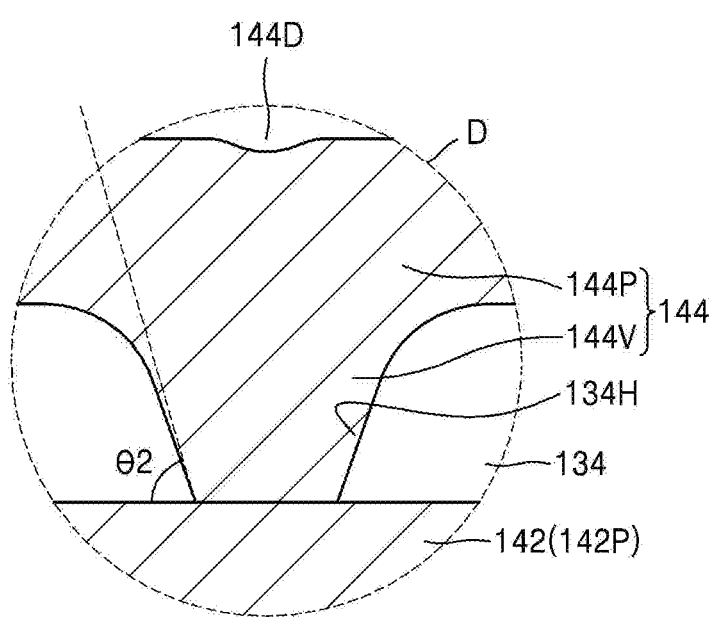

Referring to FIGS. 6L and 7D, as the second via layer 144V of the second sub-redistribution pattern 144 is formed in the second opening 134H, the shape of the second via layer 144V may be similar to the shape of the second opening 134H. The second via layer 144V may have a width, at a portion thereof near the first wiring layer 142P, that is less than a width at another portion thereof away from the first wiring layer 142P. For example, the second via layer 144V may have a shape tapering in a direction away from the first wiring layer 142P. Thus, the second via layer 144V may have a variable width, and thus may have a variable vertical profile.

In some embodiments, the second via layer 144V may have the second sidewall slope angle θ2 of less than that of the first via layer 142V (e.g., less than 70 degrees). The second sidewall slope may gradually decrease from a portion of the second via layer 144V near the first wiring layer 142P to another portion of the second via layer 144V away from the first wiring layer 142P. The second sidewall slope of the second via layer 144V, with respect to a horizontal surface, may gradually increase from a portion of the second via layer 144V near the second wiring layer 144P to another portion of the second via layer 144V away from the second wiring layer 144P. In some embodiments, the difference in horizontal width between the top and the bottom of the second via passing through the second sub-insulating interlayer 134 may be an amount that is greater than 70% of the height of the second sub-insulating interlayer 134 (e.g., it may be between 70% and 150% of the height). As such, the ratio of the difference in horizontal width between the top and the bottom of the second via passing through the second sub-insulating interlayer 134 to the height of the second sub-insulating interlayer 134 may be greater (e.g., by a factor of between 2 and 10 or even more) than the ratio of the difference in horizontal width between the top and the bottom of the first via passing through the first sub-insulating interlayer 132 to the height of the first sub-insulating interlayer 132.

The width of the second opening 134H is increased in a direction away from the first wiring layer 142P. In some embodiments, the second wiring layer 144P may be formed together with the second via layer 144V, and a dimple 144D may be formed on a top surface of a portion of the second wiring layer 144P that vertically overlaps the second via layer 144V. In other embodiments, a dimple may not be formed on a top surface of a portion of the second wiring layer 144P that overlaps the first via layer 142V shown in FIG. 7B.

Figure 7E:
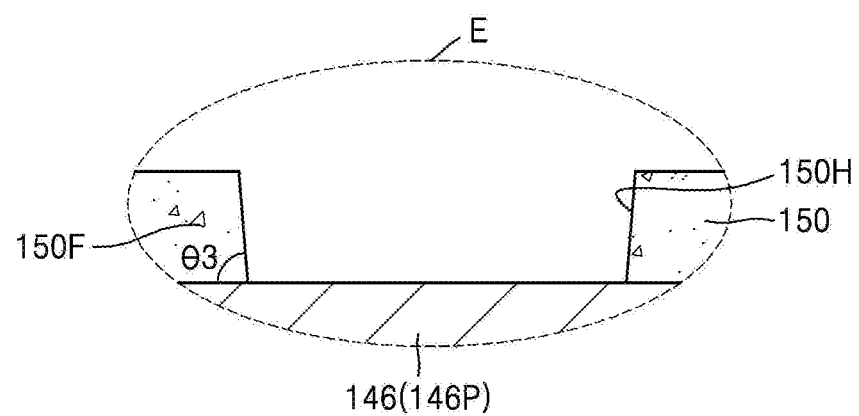

Referring to FIGS. 6N and 7E, the third opening 150H may have a width, at a portion thereof near the third wiring layer 146P of the third sub-redistribution pattern 146, that is equal to or slightly less than a width at another portion thereof away from the third wiring layer 146P. For example, the difference in horizontal width between the top and the bottom of the third opening 150H passing through the cover layer 150 may be an amount that is less than 35%, or even 10% or 5% of the height of the cover layer 150. In some embodiments, the third opening 150H may have a substantially constant width, and thus may have a relatively good vertical profile. In some embodiments, the third opening 150H may have a third sidewall slope angle θ3 of 80 to 90 degrees. The third sidewall slope may be substantially constant from a portion of the third opening 150H near the third wiring layer 146P to another portion of the third opening 150H away from the third wiring layer 146P. The first cover layer 150 may be formed of, e.g., a hydrocarbon ring compound containing a filler 150F.

Figure 7F:
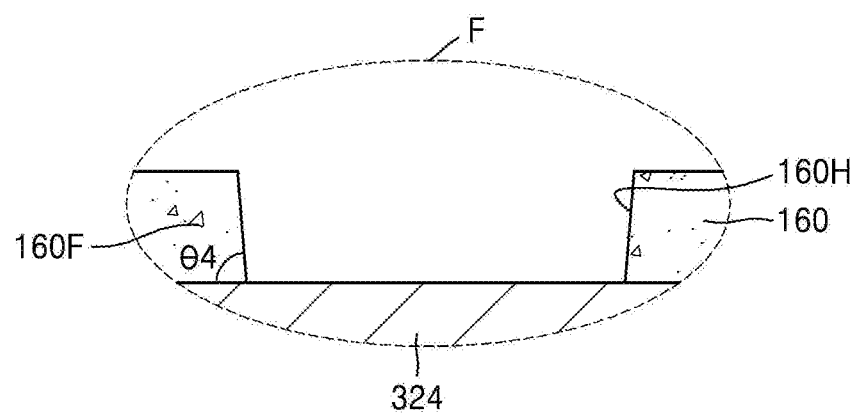

Referring to FIGS. 6P and 7F, the fourth opening 160H may have a width, at a portion thereof near the second connection pad 324, that is equal to or slightly less than a width at another portion thereof away from second connection pad 324. Thus, the fourth opening 160H may have a substantially constant width, and thus may have a relatively good vertical profile. In some embodiments, the fourth opening 160H may have a fourth sidewall slope angle θ4 of 80 to 90 degrees. For example, the difference in horizontal width between the top and the bottom of the fourth opening 160H passing through the second cover layer 160 may be an amount that is less than 35%, or even 10% or 5% of the height of the second cover layer 160. The fourth sidewall slope may be substantially constant from a portion of the fourth opening 160H near the second connection pad 324 up to another portion of the fourth opening 160H away from the second connection pad 324. The second cover layer 160 may be formed of, e.g., a hydrocarbon ring compound containing a filler 160F.

Referring to FIGS. 7A to 7F, the first opening 132H, the third opening 150H and the fourth opening 160H may have substantially the same or similar sidewall slope angles, which may be relatively close to 90 degrees. The second opening 134H may have a relatively smaller sidewall slope angle compared to the first opening 132H, the third opening 150H and the fourth opening 160H, for example, that may be 70 degrees or less.

Figure 8:
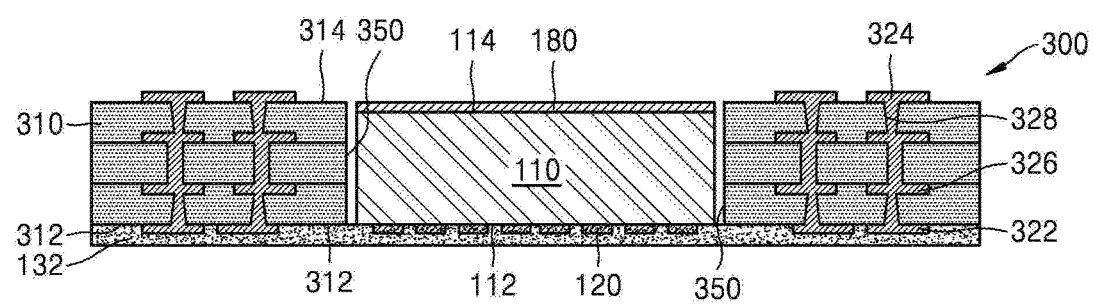
FIG. 8 is a cross-sectional view illustrating a method of manufacturing a semiconductor package according to an example embodiment.

FIG. 8 is a cross-sectional view illustrating a method of manufacturing a semiconductor package according to an example embodiment. Specifically, FIG. 8 is a cross-sectional view illustrating a method manufacturing the semiconductor package 2 of FIG. 2 and illustrates a stage between the stage illustrated in FIG. 6A and the stage illustrated in FIG. 6C.

Referring to FIG. 8, after a die attach layer 180 is attached on an inactive surface 114 of a first semiconductor chip 110, the first semiconductor chip 110 may be disposed in the cavity 350 of the PCB substrate 300 and may be attached on the first sub-insulating interlayer 132 exposed by the cavity 350. The first sub-insulating interlayer 132 may act as a supporting film to support the first semiconductor chip 110 such that the first semiconductor chip 110 is positioned in the cavity 350 penetrating the PCB substrate 300.

The first semiconductor chip 110 in the cavity 350 may be spaced apart from inner sidewalls of the cavity 350. Thus, a gap may be formed between inner sidewalls of the cavity 350 and sidewalls of the first semiconductor chip 110.

The first semiconductor chip 110 may be attached on the first sub-insulating interlayer 132 through the cavity 350 in such a way that an active surface 112 of the first semiconductor chip 110 faces the first sub-insulating interlayer 132.

The first sub-insulating interlayer 132 may completely cover the active surface 112 of the first semiconductor chip 110. A first pad 120 of the first semiconductor chip 110 that is formed on the active surface 112 may be completely covered by the first sub-insulating interlayer 132. In the case in which a top surface and sidewalls of the first pad 120 are exposed, the first sub-insulating interlayer 132 may cover the top surface and the sidewalls of the first pad 120. In some embodiments, in the case in which the sidewalls of the first pad 120 is covered by a protection layer and the top surface thereof is exposed, the first sub-insulating interlayer 132 may cover the top surface of the first pad 120.

A first surface 312 of the PCB substrate 300 may be coplanar with the active surface 112 of the first semiconductor chip 110. The first surface 312 of the PCB substrate 300 and the active surface 112 of the first semiconductor chip 110 may contact a top surface of the first sub-insulating interlayer 132 such that the top surface of the first sub-insulating interlayer 132, the active surface 112 of the first semiconductor chip 110 and the first surface 312 of the PCB substrate 300 may be positioned at the same level.

A top surface of the die attach layer 180 may be coplanar with a second surface 314 of the PCB substrate 300 shown in FIG. 8, but is not limited thereto. In some embodiments, the top surface of the die attach layer 180 may be lower than the second surface 314 of the PCB substrate 300, and thus may be positioned in the cavity 350. Next, the semiconductor package 2 of FIG. 2 may be formed by the processes as described with reference to FIGS. 6C to 6P.

FIGS. 9A to 9C are cross-sectional views and an enlarged view of a portion, illustrating stages of a method of manufacturing a semiconductor package according to an example embodiment. Specifically, FIG. 9C is an enlarged view of portion G of FIG. 9B, and FIGS. 9A to 9C illustrates a method of manufacturing the semiconductor package 3 of FIG. 3 according to an example embodiment and illustrates stages after the stage illustrated in FIG. 6G.

Referring to FIG. 9A, a second sub-insulating interlayer 134a may be formed on a first sub-insulating interlayer 132 in which a first sub-redistribution pattern 142 is formed. The second sub-insulating interlayer 134a may be formed of the same material as a first sub-insulating interlayer 132. The second sub-insulating interlayer 134a may be formed of, e.g., a hydrocarbon ring compound containing a filler. The second sub-insulating interlayer 134a may be formed of, e.g., ABF.

Referring to FIG. 9B, a second sub-distribution pattern 144a may be formed by a similar process as described in FIGS. 6D to 6G, a third sub-insulating interlayer 136a may be formed by a similar process as described in FIG. 9A, and a third sub-redistribution pattern 146a may also be formed by a similar process as described in FIGS. 6D to 6G, such that a redistribution structure 130a and 140a may be formed. Subsequently, a first cover layer 150 may be formed by a similar process as described in FIG. 6M.

Next, the semiconductor package 3 of FIG. 3 may be formed by the processes as described with reference to FIGS. 6N to 6P.

Referring to FIG. 9C, as a second via layer 144aV of the second sub-redistribution pattern 144a is formed in a second opening 134aH, a shape of the second via layer 144aV may be similar to a shape of the second opening 134aH. The second opening 134aH may be formed similarly to the first opening 132H as described in FIGS. 6D and 7A, and thus the shape of the second opening 134aH and the shape of the second via layer 144aV may be respectively similar to the shape of the first opening 132H as described in FIGS. 6D and 7A and the shape of the first via layer 142V as described in FIGS. 6F and 7B.

The second opening 134aH and the second via layer 144aV may each have a width, at a portion thereof near the first wiring layer 142P, that is equal to or slightly less than a width at another portion thereof away from the first wiring layer 142P. Thus, the second opening 134aH and the second via layer 144aV may each have a substantially constant width, and thus may have a relatively good vertical profile.

In some embodiments, the second opening 134aH and the second via layer 144aV may each have a second sidewall slope angle θ2a of 80 to 90 degrees. The second sidewall slope may be substantially constant from a portion of each of the second opening 134aH and the second via layer 144aV near a first wiring layer 142P to another portion of each of the second opening 134aH and the second via layer 144aV away from the first wiring layer 142P.

A shape of the third opening 136aH and a shape of the third via layer 146aV shown in FIG. 9B, may respectively be similar to the shape of the second opening 134aH and the shape of the second via layer 144aV.

In some embodiments, the semiconductor package 4 shown in FIG. 4 may be formed by the processes described in FIGS. 8 and 9A to 9C.

In the semiconductor packages 1, 2, 3 and the method of manufacturing thereof according to example embodiments of the present inventive concepts, the coefficient of thermal expansion (CTE) between the top portion, the bottom portion and/or the inside of the lower package can be minimized, and thus warpage of the lower package can be prevent or reduced. Accordingly, reliability degradation of the electrical connection between the lower package and the upper package can be reduced.

Additionally, in the manufacturing process, fine pitch patterns can be formed, and since a separate supporting film is not used, contamination due to residue of the separate supporting film after removal of the separate supporting film can be prevented, and thus an increase of the contact resistance due to the contamination can be prevented.

Figure 10:
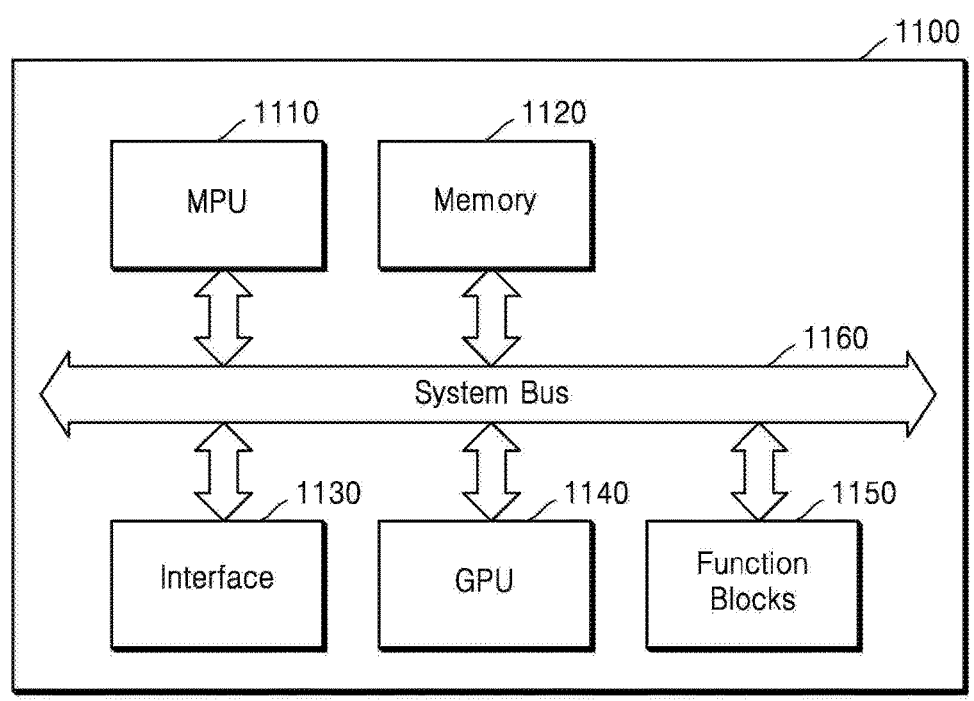
FIG. 10 is a block diagram illustrating a configuration of a semiconductor package according to an example embodiment.

FIG. 10 is a block diagram illustrating a configuration of a semiconductor package according to an example embodiment.

Referring to FIG. 10, a semiconductor package 1100 may include a micro processing unit 1110, a memory 1120, an interface 1130, a graphic processing unit 1140, functional blocks 1150 and a bus 1160 connecting therebetween. The semiconductor package 1100 may include either all of the micro processing unit 1110 and the graphic processing unit 1140, or any one thereof.

The micro processing unit 1110 may include a core and L2 cache. For example, the micro processing unit 1110 may include a multi-core. The multi-core may be the same as or different from each other in performance. The multi-core may be concurrently or separately activated. The memory 1120 may store a result of processing in the functional blocks 1150 by control of the micro processing unit 1110. For example, contents stored in the L2 cash of the micro processing unit 1110 are flushed, and thus may be stored in the memory 1120. The interface 1130 may act to interface with an external device. For example, the interface 1130 may interface with a camera, a LCP display, a speaker, or etc.

The graphic processing unit 1140 may perform graphic functions. For example, the graphic processing unit 1140 may perform video or 3-D graphics.

The functional blocks 1150 may perform various functions. For example, in the case in which the semiconductor package 1100 includes an application processor used for a mobile device, some of the functional blocks 1150 may perform a communication function.

The semiconductor package 1100 may include at least one of the semiconductor packages 1, 2, 3 and 4 shown in FIGS. 1 to 4. The micro processing unit 1110 and/or the graphic processing unit 1140 may respectively be at least one of the lower packages 100, 100a, 100b and 100c shown in FIGS. 1 to 4. The memory 1120 may be the upper package 200 shown in FIGS. 1 to 4.

The interface 1130 and the functional blocks 1150 may correspond to parts of the respective lower packages 100, 100a, 100b and 100c.

While the present inventive concepts have been particularly shown and described with reference to example embodiments thereof, it will be understood by those of ordinary skill in the art that various changes in form and details may be made therein without departing from the spirit and scope of the present disclosure.

We claim:

1. A package on package type semiconductor package comprising:
   a first package, wherein the first package comprises:
      a printed circuit board (PCB) substrate having a first surface and a second surface opposite to the first surface, wherein the PCB substrate includes a plurality of base layers and a cavity penetrating the plurality of base layers;
      a first semiconductor chip in the cavity, wherein the first semiconductor chip has an active surface and an inactive surface opposite to the active surface;
      a redistribution structure on the first surface of the PCB substrate and on the active surface of the first semiconductor chip;
      a first cover layer covering the redistribution structure; and
      a second cover layer covering the second surface of the PCB substrate and the inactive surface of the first semiconductor chip;
   and
   a second package on the first package, wherein the second package is positioned on the second cover layer of the first package and includes a second semiconductor chip,
   wherein the redistribution structure comprises:
      a first sub-insulating interlayer on the active surface of the first semiconductor chip and on the first surface of the PCB substrate;
      a first via layer penetrating the first sub-insulating interlayer;
      a first wiring layer on the first sub-insulating interlayer;
      at least a second sub-insulating interlayer on the first sub-insulating interlayer, the second sub-insulating interlayer covering at least a portion of the first wiring layer;
      a second via layer penetrating the second sub-insulating interlayer; and
      a second wiring layer on the second sub-insulating interlayer,
      wherein the first cover layer, the second cover layer and the first sub-insulating interlayer are formed of the same material.

2. The semiconductor package according to claim 1, wherein the first cover layer, the second cover layer and the first sub-insulating interlayer are formed of a hydrocarbon ring compound containing a filler.

3. The semiconductor package according to claim 2, wherein the second sub-insulating interlayer is formed of a filler-free resin.

4. The semiconductor package according to claim 1, wherein the first via layer includes a first via passing vertically through the first sub-insulating interlayer, and the second via layer includes a second via passing vertically through the second sub-insulating interlayer, and the first via and second via have different vertical profiles.

5. The semiconductor package according to claim 1, wherein the first via layer includes a first via passing vertically through the first sub-insulating interlayer, and the second via layer includes a second via passing vertically through the second sub-insulating interlayer and a sidewall slope angle of the first via with respect to a horizontal plane is greater than a sidewall slope angle of the second via with respect to the horizontal plane.

6. The semiconductor package according to claim 1, wherein the first via layer includes a first via passing vertically through the first sub-insulating interlayer, and the second via layer includes a second via passing vertically through the second sub-insulating interlayer, and a width of the first via from bottom to top of the first via is constant, and
   wherein the second via is connected to the first wiring layer and a width of a portion of the second via near the first wiring layer is less than a width of another portion of the second via away from the first wiring layer.

7. The semiconductor package according to claim 1, wherein the first via layer is integrally coupled to the first wiring layer,
   wherein the second sub-insulating interlayer is part of a plurality of sub-insulating interlayers formed on the first sub-insulating interlayer, and a respective via layer penetrates each of the plurality of sub-insulating interlayers and a respective wiring layer is on each of the plurality of sub-insulating interlayers, and
   wherein each respective via layer is integrally coupled to its respective wiring layer.

8. The semiconductor package according to claim 7, wherein the via layer for each second sub-insulating interlayer includes vertical vias each having a sidewall slope angle gradually increasing in a direction away from its respective wiring layer.

9. The semiconductor package according to claim 8, wherein the second wiring layer further comprises a dimple on a top surface of portions of the second wiring layer that overlaps the vertical vias.

10. The semiconductor package according to claim 1, wherein the first cover layer, the second cover layer and the first sub-insulating interlayer are formed of ajinomoto build-up film (ABF), and the second sub-insulating interlayer is formed of a photo-imageable dielectric material.

11. The semiconductor package according to claim 1, wherein the first cover layer, the second cover layer, the first sub-insulating interlayer and the second sub-insulating interlayer are formed of a hydrocarbon ring compound.

12. A fan out wafer level package type semiconductor package, comprising:
   a substrate having a first surface and a second surface opposite to the first surface, wherein the substrate comprises:
      a plurality of base layers:
      first connection pads on the first surface and second connection pads on the second surface;
      a plurality of conductive vias penetrating the respective ones of the plurality of base layers to electrically connect each first connection pad to a respective second connection pad; and
      a cavity penetrating the plurality of base layers and spaced apart from the plurality of conductive vias, the first connection pads and the second connection pads;
   a semiconductor chip in the cavity and spaced apart from an inner sidewall of the cavity, wherein the semiconductor chip includes a plurality of pads including a first pad on an active surface of the semiconductor chip;
a redistribution structure on the first surface of the substrate and the active surface of the semiconductor chip;
a first cover layer covering the redistribution structure; and
a second cover layer covering an inactive surface of the semiconductor chip and the second surface of the substrate,
wherein the redistribution structure comprises:
 a first sub-insulating interlayer on the first surface of the substrate and on the active surface of the semiconductor chip;
 at least one second sub-insulating interlayer on the first sub-insulating interlayer;
 a first via layer penetrating the first sub-insulating interlayer;
 a second via layer penetrating each second sub-insulating interlayer of the at least one second sub-insulating interlayer, respectively, and
 wherein the first cover layer, the second cover layer and the first sub-insulating interlayer are formed of a same material.

13. The semiconductor package according to claim 12, wherein the first cover layer, the second cover layer and the first sub-insulating interlayer are formed of a hydrocarbon ring compound containing a filler, and each second sub-insulating interlayer of the at least one second sub-insulating interlayer is formed of a filler-free resin.

14. The semiconductor package according to claim 12, wherein a width of a first via of the first via layer is constant from top to bottom of the first via layer, and a sidewall slope angle of a second via of the second via layer is smaller than a sidewall slope angle of the first via of first via layer.

15. The semiconductor package according to claim 12, wherein the redistribution structure further comprises:
 a first wiring layer on the first sub-insulating interlayer; and
 a second wiring layer on each second sub-insulating interlayer of the at least one second sub-insulating interlayer, and
 wherein the first via layer is integrally coupled to the first wiring layer, and the second via layer is integrally coupled to the first wiring layer.

16. The semiconductor package according to claim 15, wherein a portion of the second wiring layer is an external connection pad exposed by the first cover layer and the second connection pads are exposed by the second cover layer.

17. The semiconductor package according to claim 12, further comprising a die attach layer between the second cover layer and the inactive surface of the semiconductor chip.

18. A semiconductor package, comprising:
a redistribution structure including a plurality of insulating interlayers, a first surface, and a second surface opposite the first surface, wherein:
 first pads at the first surface are connected to external package connection terminals, and
 each insulating interlayer includes a plurality of conductive vias passing therethrough, each conductive via connected to a respective conductive via of another insulating interlayer and connected to a respective first pad;
a first semiconductor chip and a substrate disposed on the second surface of the redistribution structure, wherein the first semiconductor chip is disposed in a cavity of the substrate and has a first surface facing the redistribution structure and a second surface opposite the first surface;
a first cover layer covering the first surface of the redistribution structure;
a second cover layer covering the second surface of first semiconductor chip;
a first sub-insulating layer, which is one of the insulating interlayers of the redistribution structure, covering the first surface of the first semiconductor chip; and
a second semiconductor chip formed above the first semiconductor chip and on the substrate, wherein
the first cover layer, second cover layer, and first sub-insulating layer each have the same coefficient of thermal expansion.

19. The package of claim 18, wherein:
the first cover layer, second cover layer, and first sub-insulating layer are formed of the same composition of materials as each other.

20. The package of claim 18, wherein:
the first sub-insulating insulating interlayer of the redistribution structure contacts the first surface of the first semiconductor chip and includes a plurality of first conductive vias passing therethrough, and further comprising:
a second sub-insulating layer, which is one of the insulating interlayers of the redistribution structure, formed on the first sub-insulating layer, and including a plurality of second conductive vias passing therethrough and respectively connected to the plurality of first conductive vias, wherein:
each of the first conductive vias pass vertically through the first sub-insulating layer and have first sidewalls, and
each of the second conductive vias respectively connected to the first conductive vias pass vertically through the second sub-insulating layer and have second sidewalls.

* * * * *